(12) United States Patent
Romero et al.

(10) Patent No.: US 9,236,292 B2
(45) Date of Patent: Jan. 12, 2016

(54) SELECTIVE AREA DEPOSITION OF METAL FILMS BY ATOMIC LAYER DEPOSITION (ALD) AND CHEMICAL VAPOR DEPOSITION (CVD)

(71) Applicants: Patricio E. Romero, Portland, OR (US); Scott B. Clendenning, Portland, OR (US); Jeanette M. Roberts, Hillsboro, OR (US); Florian Gstrein, Portland, OR (US)

(72) Inventors: Patricio E. Romero, Portland, OR (US); Scott B. Clendenning, Portland, OR (US); Jeanette M. Roberts, Hillsboro, OR (US); Florian Gstrein, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/133,262

(22) Filed: Dec. 18, 2013

(65) Prior Publication Data
US 2015/0170961 A1    Jun. 18, 2015

(51) Int. Cl.
*H01L 21/768* (2006.01)

(52) U.S. Cl.
CPC ................ *H01L 21/76838* (2013.01)

(58) Field of Classification Search
CPC ............................... H01L 21/76838
USPC ......................... 438/641, 674–677
See application file for complete search history.

(56) References Cited

U.S. PATENT DOCUMENTS

| 2002/0027261 A1* | 3/2002 | Besser et al. ................ 257/584 |
| 2011/0108990 A1* | 5/2011 | Bonilla et al. ............... 257/761 |
| 2014/0332964 A1* | 11/2014 | Yang et al. ................ 257/762 |

OTHER PUBLICATIONS

Roberts, Jeanette et al., "Selective Metal Deposition on Cu," 13th International Conference on Atomic Layer Deposition, San Diego, CA, Jul. 28-31, 2013 (presented Jul. 30, 2013), 18 pgs.
Roberts, Jeanette et al., "Selective Mn deposition on Cu lines," 12th International Conference on Atomic Layer Deposition, Dresden Germany, Jun. 17-20, 2012 (presented Jun. 19, 2012) 2 pgs.
Knisley, Thomas J. et al., "Volatility and High Thermal Stability in Mid- to Late-First-Row Transition-Metal Diazadienyl Complexes," American Chemical Society, Organometallics, 2011, 30, 5010-5017.
PCT Patent Application No. PCT/US2013/062323 filed Sep. 27, 2013, 47 pgs.

\* cited by examiner

*Primary Examiner* — Mamadou Diallo
(74) *Attorney, Agent, or Firm* — Blakely, Sokoloff, Taylor & Zafman LLP

(57) ABSTRACT

Selective area deposition of metal films by atomic layer deposition (ALD) and chemical vapor deposition (CVD) is described. In an example, a method of fabricating a metallization structure for an integrated circuit involves forming an exposed surface above a substrate, the exposed surface including regions of exposed dielectric material and regions of exposed metal. The method also involves forming, using a selective metal deposition process, a metal layer on the regions of exposed metal without forming the metal layer on the regions of exposed dielectric material.

9 Claims, 16 Drawing Sheets

Table 300

| Metal | $E_{1/2}$ Reduction (V) |
|---|---|
| Co | -2.82 |
| Mn | -2.73 |
| Cr | -2.09 |

FIG. 4   FIG. 5

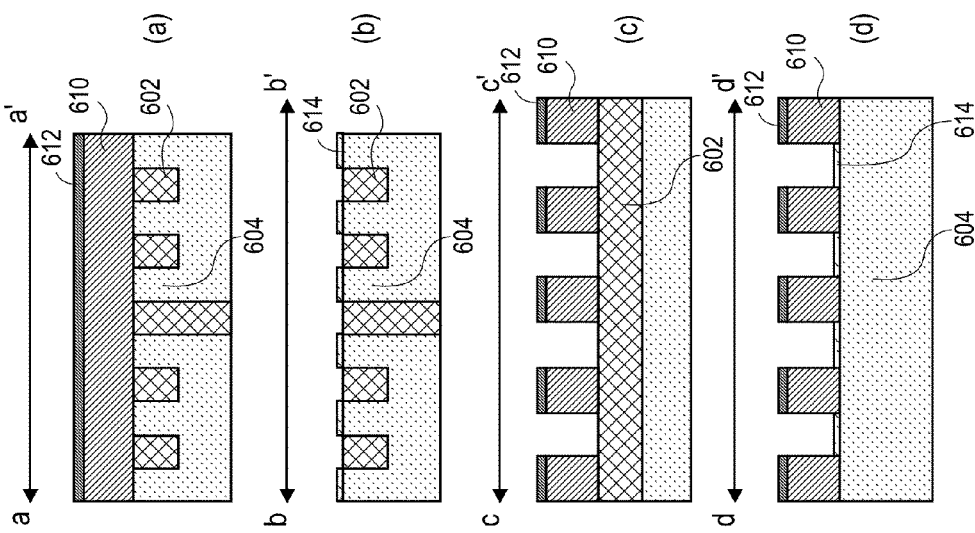
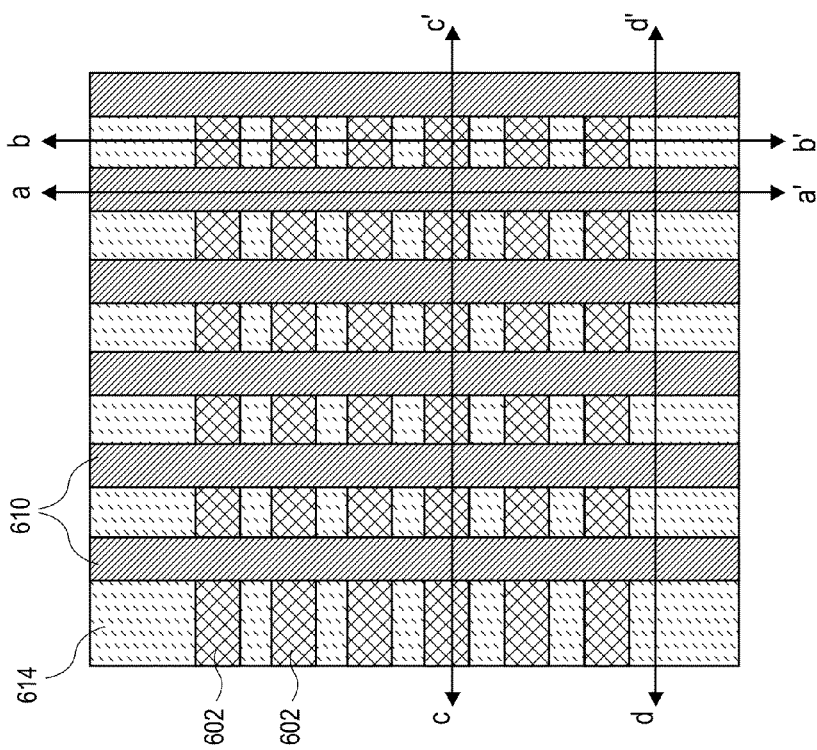
FIG. 6C

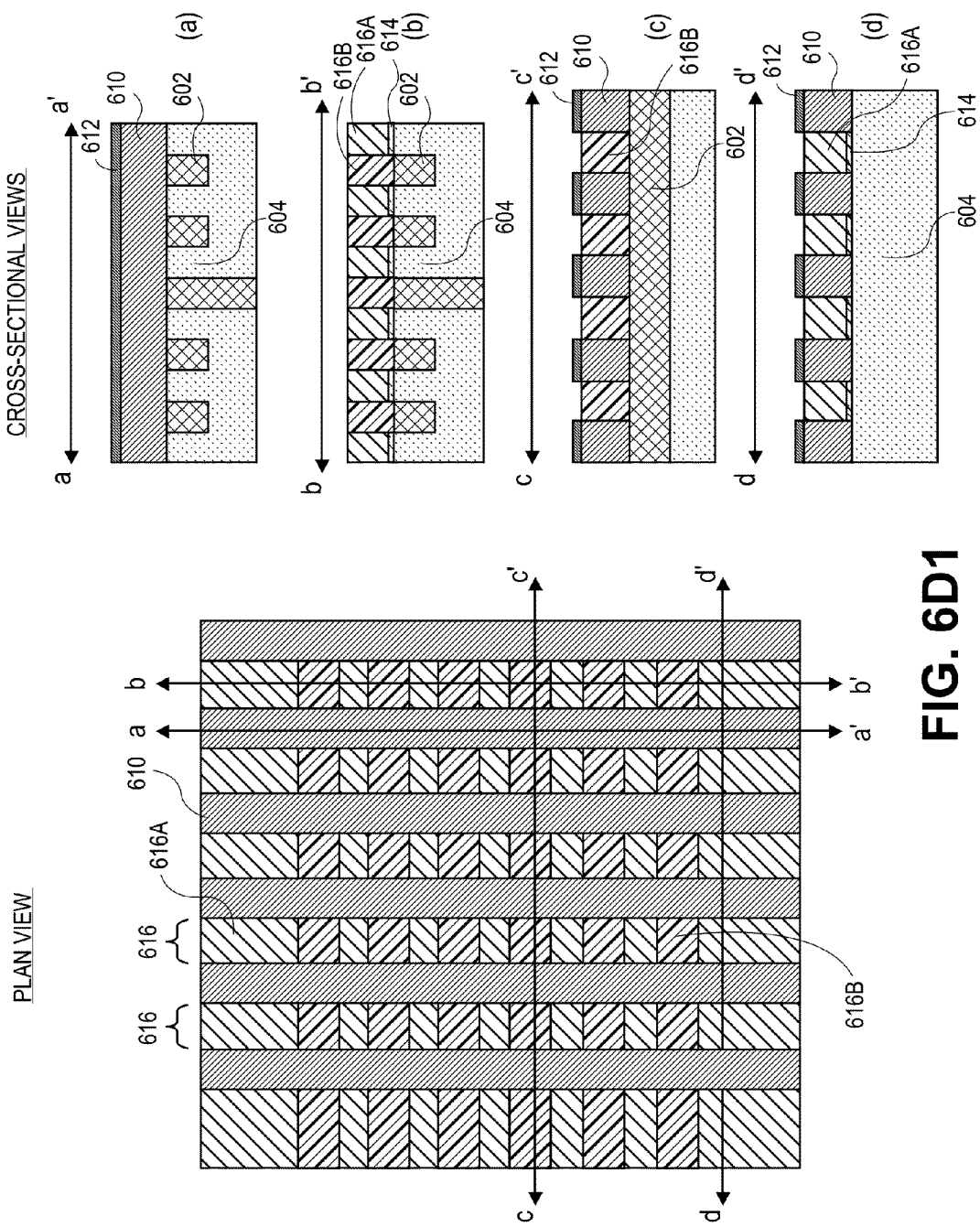
FIG. 6D1

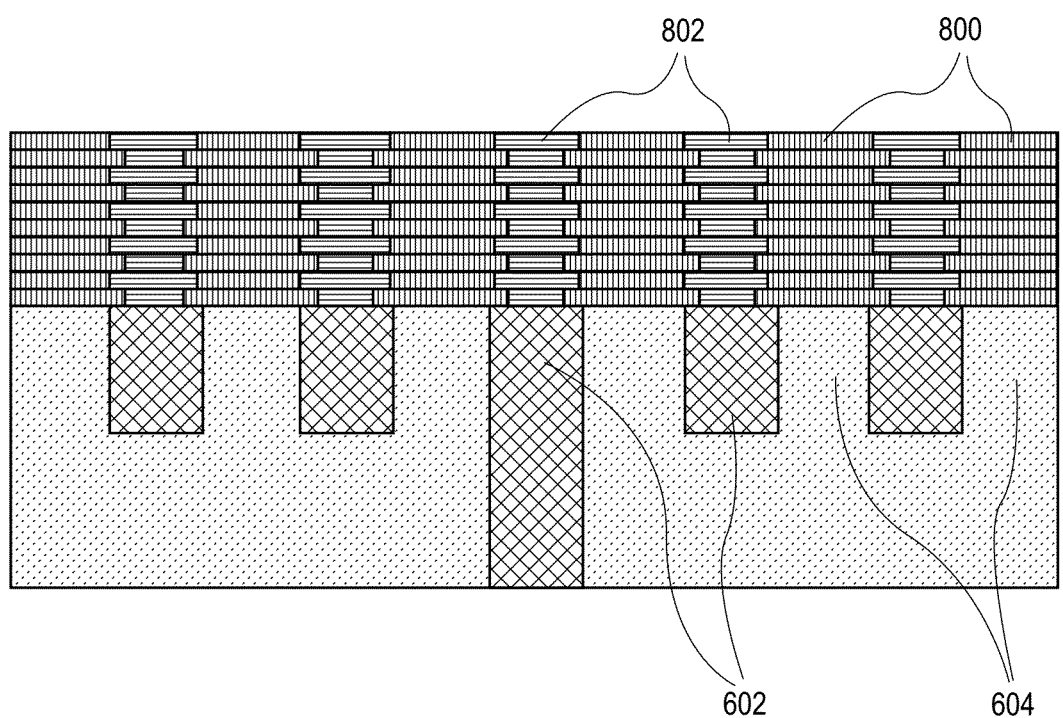
FIG. 6D2

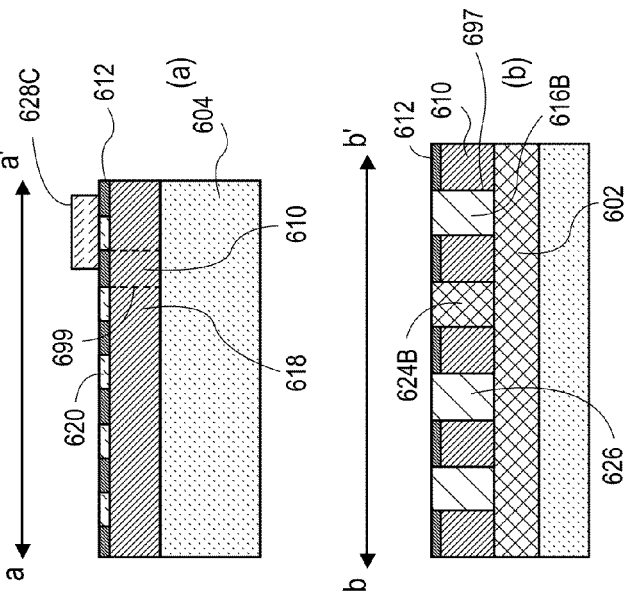
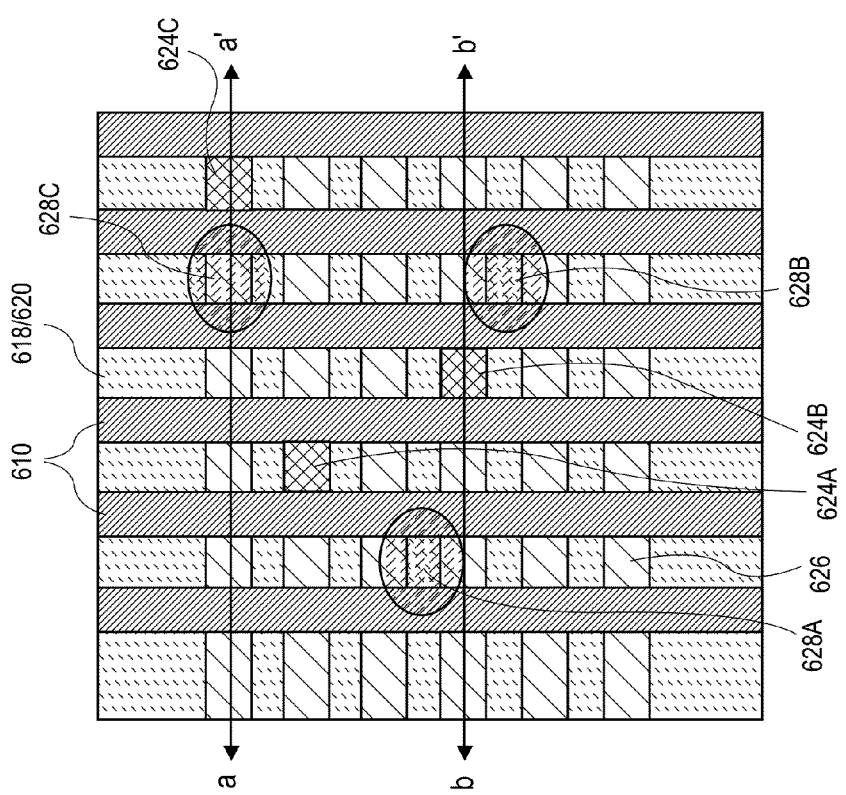
FIG. 6J

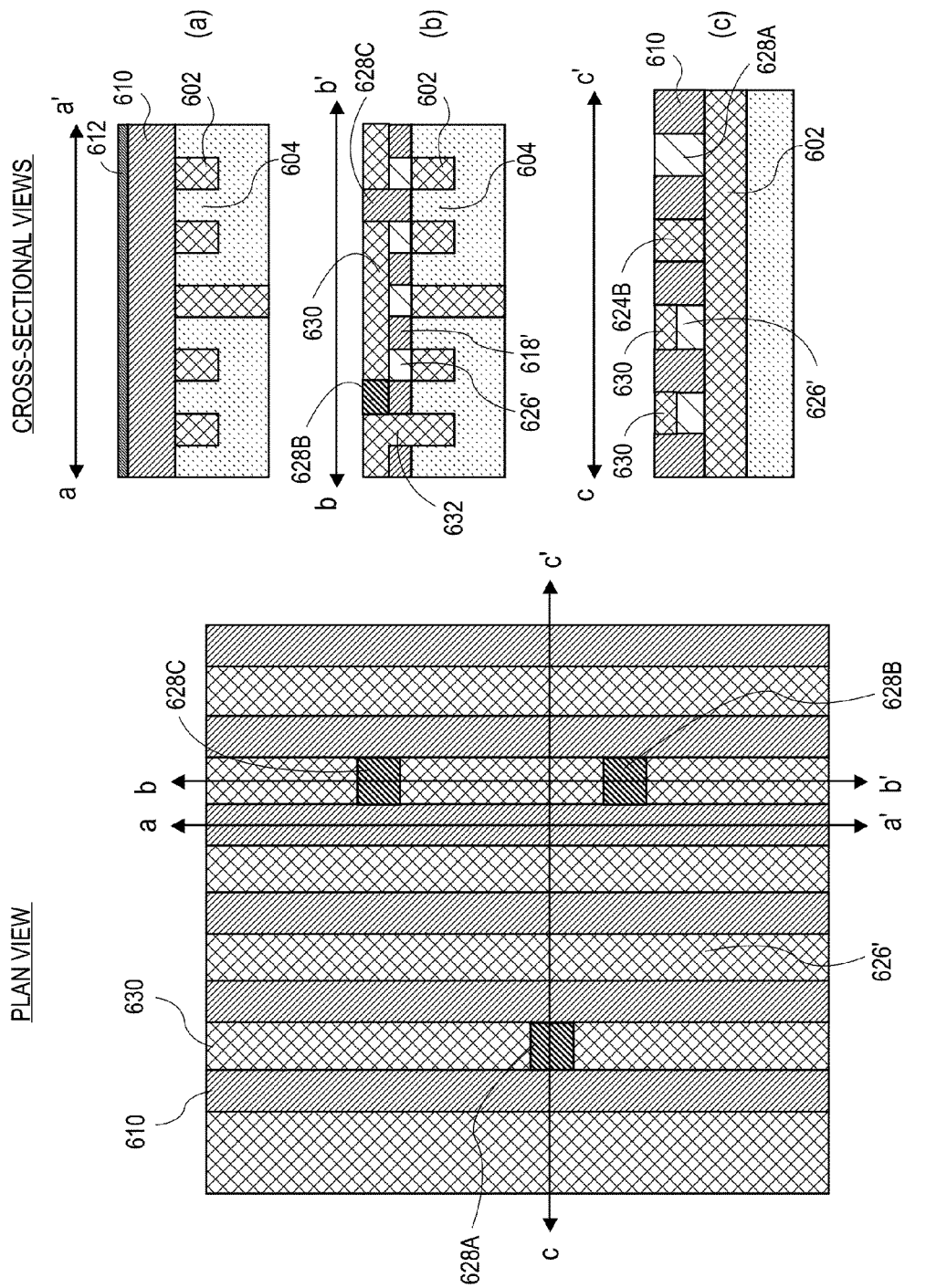

SELECTIVE AREA DEPOSITION OF METAL FILMS BY ATOMIC LAYER DEPOSITION (ALD) AND CHEMICAL VAPOR DEPOSITION (CVD)

TECHNICAL FIELD

Embodiments of the invention are in the field of semiconductor structures and processing and, in particular, selective area deposition of metal films by atomic layer deposition (ALD) and chemical vapor deposition (CVD).

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing.

A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

BRIEF DESCRIPTION OF THE DRAWINGS

FIGS. 4 and 5 include a pre scanning electron microscope (SEM) image and post SEM image, respectively, showing selective deposition of a cobalt (Co) cap on exposed W lines formed in silicon dioxide, in accordance with an embodiment of the present invention.

FIGS. 6A-6L illustrate portions of integrated circuit layers representing various operations in a method of self-aligned via and metal patterning, in accordance with an embodiment of the present invention, where:

FIG. 6A illustrates a plan view and corresponding cross-sectional views of options for a previous layer metallization structure;

FIG. 6B illustrates a plan view and corresponding cross-sectional views of the structure of FIG. 6A following formation of interlayer dielectric (ILD) lines above the structure of FIG. 6A;

FIG. 6C illustrates a plan view and corresponding cross-sectional views of the structure of FIG. 6B following selective differentiation of all the potential via locations from all of the plug locations;

FIG. 6D1 illustrates a plan view and corresponding cross-sectional views of the structure of FIG. 6C following differential polymer addition to the exposed portions of underlying metal and ILD lines of FIG. 6C;

FIG. 6D2 illustrates a cross-sectional view of the structure of FIG. 6B following selective material deposition on the exposed portions of underlying metal and ILD lines, in accordance with another embodiment of the present invention;

FIG. 6E illustrates a plan view and corresponding cross-sectional views of the structure of FIG. 6D1 following removal of one species of polymer;

FIG. 6F illustrates a plan view and corresponding cross-sectional views of the structure of FIG. 6E following formation of an ILD material in the locations opened upon removal of the one species of polymer;

FIG. 6G illustrates a plan view and corresponding cross-sectional views of the structure of FIG. 6F following via patterning;

FIG. 6H illustrates a plan view and corresponding cross-sectional views of the structure of FIG. 6G following via formation using a selective metal deposition process;

FIG. 6I illustrates a plan view and corresponding cross-sectional views of the structure of FIG. 6H following removal of the second species of polymer and replacement with an ILD material;

FIG. 6J illustrates a plan view and corresponding cross-sectional views of the structure of FIG. 6I following patterning of a resist or mask in selected plug locations;

FIG. 6K illustrates a plan view and corresponding cross-sectional views of the structure of FIG. 6J following hardmask removal and ILD layer recessing;

FIG. 6L illustrates a plan view and corresponding cross-sectional views of the structure of FIG. 6K following metal line formation.

DESCRIPTION OF THE EMBODIMENTS

Figure 1:
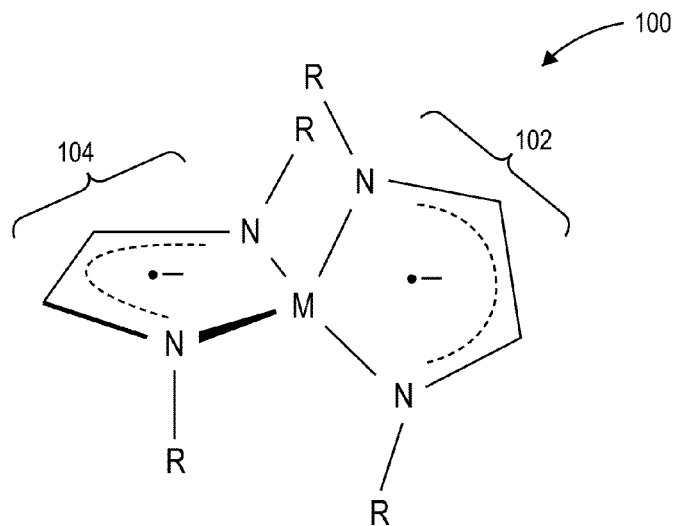
FIG. 1 is a chemical representation illustrating a homoleptic N,N'-dialkyl-diazabutadiene metal precursor, in accordance with an embodiment of the present invention.

Selective area deposition of metal films by atomic layer deposition (ALD) and chemical vapor deposition (CVD) is described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to selective area deposition of metal films by atomic layer deposition (ALD) and/or chemical vapor deposition (CVD). To provide context, the ability to selectively deposit metal on one surface over another can enable new integration and patterning schemes as well as decrease the number of manufacturing operations otherwise associated with a semiconductor manufacturing process. In accordance with an embodiment of the present invention, a precursor class is described with built-in structural features that enable the ALD or CVD of late transition metals on metallic surfaces while avoiding deposition on adjacent dielectric surfaces such as silicon dioxide ($SiO_2$) or low-k inter layer dielectric layers (ILDs). In one embodiment, the selectivity is inherent to the precursor and, as such, chemical passivation of the undesired or adjacent surface may not be needed. In a particular embodiment, the approaches described herein can be used to enable electroless via bottom-up fill on non-catalytic metals and can also enable self-aligned bottom-up interconnect design, examples of which are described in greater detail below.

Generally, in accordance with one or more embodiments of the present invention, there is currently no unified solution for selective deposition of metals on metals in semiconductor processing. However, embodiments described herein can be used to provide several general benefits from a manufacturing point of view such as, but not limited to: (1) films are deposited by thermal ALD or CVD, thus maximizing film conformality and minimizing damage to device structures as is otherwise observed with plasma-enhanced processes; (2) the precursor design is widely applicable to a variety of metals including, but not limited to: cobalt (Co), manganese (Mn), nickel (Ni), iron (Fe) or chromium (Cr), and provides access to high metal content films (e.g., greater than approximately 90%) under thermal deposition conditions; (3) in some cases, the selective deposition process can be achieved without special pre-treatment of the exposed, competing surfaces, e.g., without chemical passivation of either the low-k dielectric or pre-cleaning of the metal surface; (4) metal cap growth can be achieved on so-called "non-catalytic" metals such as tungsten (W), thus enabling electroless via bottom-up fill; (5) the processes do not require the use of lithographic patterning schemes or masks to define the selectivity of a corresponding process—rather, the processes rely on inherent differences in chemical reactivity; and/or (6) selective metal on metal growth can be used for self-aligned next layer interconnect fabrication.

More specifically, in one or more embodiments, approaches are provided for the deposition of a variety of transition metals selectively on metal surfaces, while avoiding deposition on contiguous, hydrophilic and generic low-k dielectric substrates. In one such embodiment, a selective metal deposition is accomplished by thermal ALD or CVD using a homoleptic N,N'-dialkyl-diazabutadiene metal precursor and may use a suitable co-reactant such as a hydrogen or ammonia. In an embodiment, the selective deposition can be performed with or without pretreatment of an adjacent or nearby low-k substrate. In one embodiment, the nature of one or more of the processes described herein (e.g., precursor type, surfaces and deposition schemes) render one or more of the approaches directly applicable for back end of line (BEOL) integration and self-aligned patterning schemes.

As an example, FIG. 1 is a chemical representation illustrating a homoleptic N,N'-dialkyl-diazabutadiene metal precursor 100, in accordance with an embodiment of the present invention. Referring to FIG. 1, the N,N'-dialkyl-diazabutadiene metal precursor 100 includes a metal center, M, which may be a metal such as but not limited to, Mn, Cr, Fe, Co or Ni. In the example shown, the N,N'-dialkyl-diazabutadiene metal precursor 100 includes two N,N'-dialkyl-diazabutadiene ligands 102 and 104, respectively. It is to be appreciated that precursors may also be considered having only one N,N'-dialkyl-diazabutadiene ligand, or more than two N,N'-dialkyl-diazabutadiene ligands. The alkyl groups, R, may be bulky alkyl groups such as, but not limited to, ethyl, isopropyl, sec-butyl, tert-butyl, cyclohexyl and phenyl. It is also to be appreciated that the R groups within a single N,N'-dialkyl-diazabutadiene ligand need not be identical. Furthermore, the R groups between different N,N'-dialkyl-diazabutadiene ligands need not be identical. Additionally, in other embodiments, one or more R groups instead of hydrogen may be included on one or both of the carbon atoms in the backbone of the diazabutadiene metal precursor 100. This may allow fabrication of bulkier ligands and may have applications for molybdenum (Mo), ruthenium (Ru) or tungsten (W) metal centers, as described below.

Referring again to FIG. 1, more generally, the motif of a suitable precursor is generally applicable to first row, late-transition metals (e.g., M=Cr, Mn, Fe, Co, Ni) but it could be expanded to heavier elements by variation of the R group(s). In one such embodiment, the metal is one such as, but not limited to: molybdenum (Mo), ruthenium (Ru) or tungsten (W), and three N,N'-dialkyl-diazabutadiene ligands are used per metal center. The bulky substituent on nitrogen (e.g., R is typically $^t$Bu) sterically protects the metal center from direct undesirable reactions with an adjacent or nearby dielectric surface (e.g., low-k or $SiO_2$) by providing an effective hydrophobic pocket. The selectivity for metal surfaces can be achieved by direct interaction of the diazabutadiene ligand with the conducting sea of electrons on the metal surface, by nature of its redox non-innocence. More generally, in an embodiment, the suitability of such complexes can be described as molecules possessing electron-acceptor ligands on late transition metal centers. The complexes are sterically protected and redox active, with electrons stored in the ligands.

Figure 2:
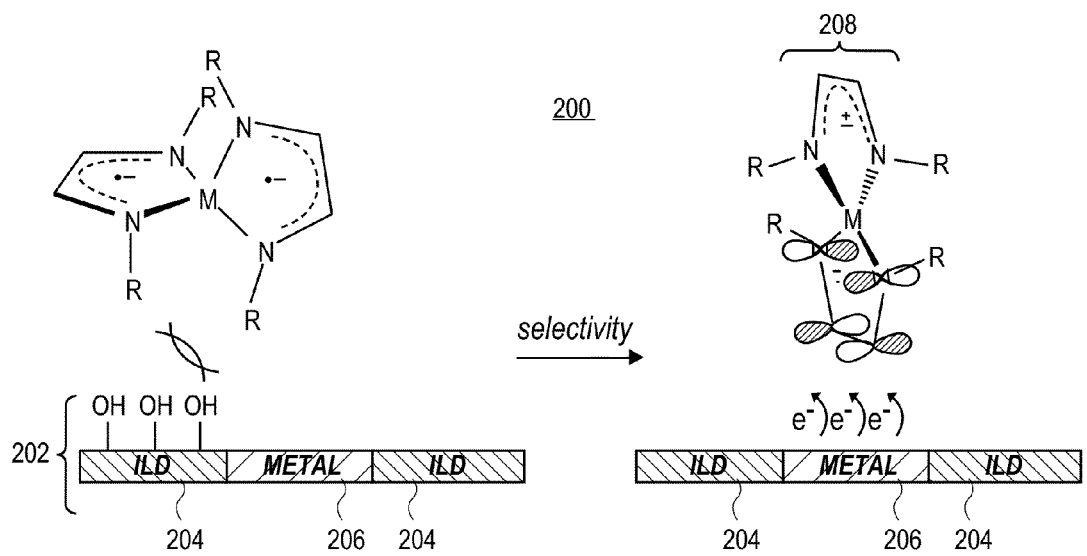
FIG. 2 illustrates a schematic showing chemical selectivity for metal over ILD as designed into the metal precursor, in accordance with an embodiment of the present invention.

As an example, FIG. 2 illustrates a schematic 200 showing chemical selectivity for metal over ILD as designed into the metal precursor, in accordance with an embodiment of the present invention. Referring to schematic 200, a surface 202 is provided having alternating exposed ILD portions 204 and exposed metal portions 206. The exposed ILD portions 204 may include a surface termination such as —OH termination, as is shown. A metal precursor 208, such as a precursor described in association with FIG. 1, is inhibited from reacting with the exposed ILD portions 204 but is encouraged to react with the exposed metal portions 206. In one embodiment, the inhibition from the metal precursor 208 reacting with the exposed ILD portions 204 and corresponding favorability of reacting with the exposed metal surface 206 is electron driven, as depicted. Thus, metal-diazabutadiene precursors enable selective metal on metal deposition, as exemplified above. In one such embodiment, the selective deposition is achieved without protecting or passivating either the exposed ILD portions 204 or the exposed metal portions 206 and, as such, the deposition is directly on the exposed metal portions 206 while the exposed ILD portions 204 are directly exposed to the precursors. In an embodiment, the exposed metal portions 206 metal portions are composed of a pure metal such as, but not limited to, copper, nickel, cobalt, manganese, ruthenium, molybdenum or tungsten, or a conductive metal containing allow such as, but not limited to, titanium nitride, vanadium nitride or tungsten nitride.

Figure 3:
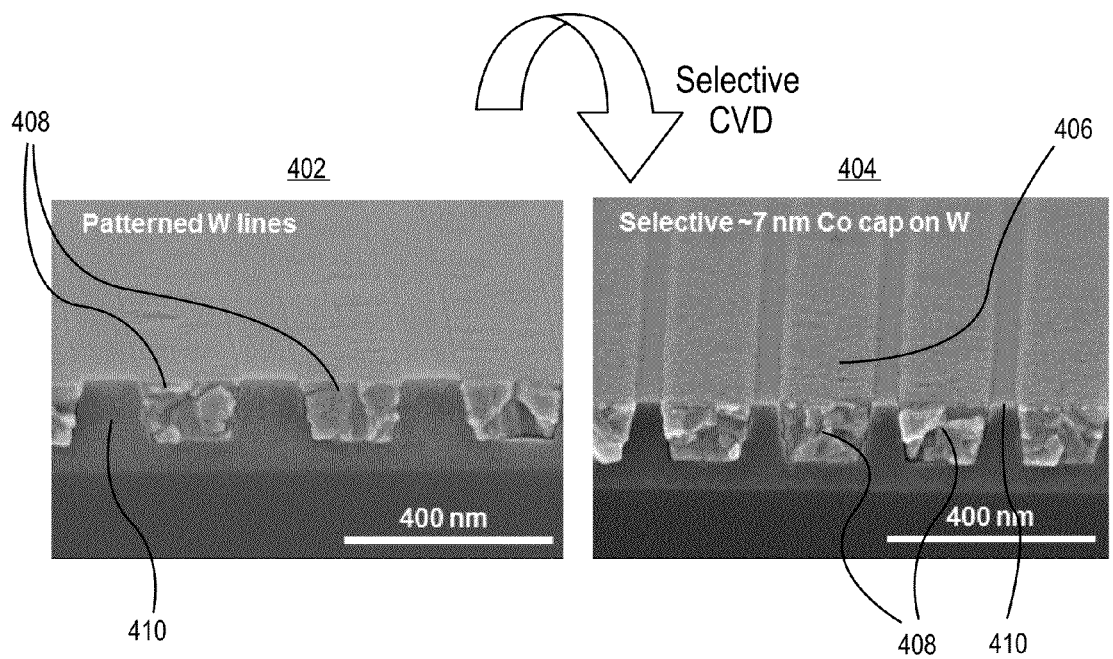
FIG. 3 includes a Table of E½ reduction potentials (in Volts) for a Co complex, a Mn complex, and a Cr complex, in accordance with an embodiment of the present invention.

Several examples of the precursors described in association with FIG. 1 have been demonstrated as having accessible, low energy electron acceptor levels. For example, FIG. 3 includes a Table 300 of E½ reduction potentials (in Volts) for a Co complex, a Mn complex, and a Cr complex, in accordance with an embodiment of the present invention. Referring to Table 300 and FIG. 1, where M=Co, Mn or Cr, the E½ reduction (in Volts) is −2.82, −2.73, and −2.09, respectively. As such, separate solution cyclic voltammetry experiments confirm the presence of accessible, low energy electron acceptor levels in such complexes.

In one aspect, selective deposition of cobalt (Co) on post-chemical mechanical polish (CMP) tungsten (W) lines in silicon dioxide ($SiO_2$) has been demonstrated. For example, FIGS. 4 and 5 include a pre scanning electron microscope (SEM) image 402 and post SEM image 404, respectively, showing selective deposition of a cobalt (Co) cap 406 on exposed W lines 408 formed in silicon dioxide 410, in accordance with an embodiment of the present invention. Referring to FIGS. 4 and 5, with substrate temperatures approximately in a range of 175-250 degrees Celsius, as much as 14 nm of Co is grown on top of W, with no visible deposition on the adjacent $SiO_2$. The deposition is performed using the complex of FIG. 1 where M=Co and R=tBu.

The above described selective deposition of Co on W has been extended to growth of a catalytic cap on W at the bottom of a via structure in a low-k ILD material. For example, selective deposition of a cobalt (Co) cap on underlying exposed W contacts through a via opening formed in a low-k ILD material, in accordance with an embodiment of the present invention using precursors as described herein can thus be used to enable bottom-up electroless via fill.

Referring again to FIGS. 1-5 described above, in an embodiment, selective deposition schemes in the interconnect space can benefit from such selective metal deposition approaches. Final interconnect structures may include detectable discrete layers of metals such as, but not limited to, Cr, Mn, Fe, Co and Ni via standard materials analysis (e.g., SEM, TEM, XPS, AES, EDS, EELS etc.) at the bottom of an interconnect structure combined with their absence in adjacent dielectric surfaces. Additionally, such deposited films may include nitrogen and/or carbon as impurities in the films.

As such, one or more embodiments provide approaches for selectively depositing metallic films by a thermal ALD or CVD, while avoiding undesirable metallic contamination of neighboring (low-k) dielectric layers. Depending on the substrate in play, a direct way to deposit "metal on metal" with or without the need for pre-treatment of either the metallic or dielectric surface is thus achieved. While the selective deposition per se constitutes a significant advance in comparison to existing methods, there are other advantages for manufacturing such as the circumvention of substrate passivation or the use of lithographic patterning to direct the selectivity. The approaches are also applicable to a variety of different metals and can be employed in self-aligned next layer interconnect patterning scheme, an example of which is described below.

Thus, in another aspect, one or more embodiments described herein are directed to self-aligned via and plug patterning. The self-aligned aspect of the processes described herein may be based on a directed self-assembly (DSA) mechanism, as described in greater detail below. However, it is to be understood that selective growth mechanisms may be employed in place of, or in combination with, DSA-based approaches. In an embodiment, processes described herein enable realization of self-aligned metallization using selective metal deposition for back-end of line feature fabrication.

To provide context, patterning and aligning of features at less than approximately 50 nanometer pitch requires many reticles and critical alignment strategies that are extremely expensive for a semiconductor manufacturing process. Generally, embodiments described herein involve the fabrication of metal and via patterns based on the positions of an underlying layer. That is, in contrast to conventional top-down patterning approaches, a metal interconnect process is effectively reversed and built from the previous layer up. This is in contrast to a conventional approach where an interlayer dielectric (ILD) is first deposited, with a pattern for metal and via layers subsequently patterned therein. In the conventional approach, alignment to a previous layer is performed using a lithography scanner alignment system. The ILD is then etched.

More specifically, one or more embodiments are directed to an approach that employs an underlying metal as a template to build the conductive vias and non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

As illustrated below, self-aligned via and metal patterning approaches described herein may include one or more of the following aspects or attributes: (a) a bottom up super-self-aligned via/metal patterning process is enabled; (b) a previous layer metal is used to direct positions of vias on the layer formed above; (c) a process that generates every possible via and metal line end position but maintains only required or desired via and metal line end positions; (d) the position and shape of vias and metal line ends are pre-formed from a previous layer pattern; (e) an intersection of metal below and above naturally forms the fully self-aligned via positions; (f) via and plugs position, size and shape are defined by a pre-existing grating lithography from underlying metal layers; (g) via and plug lithography is required only for selecting one or another and does not affect the position, shape or size of the features (e.g., LWR is irrelevant); (h) processes described herein may be characterized as an upside down dual-damascene or via/plug first approach; (i) corresponding lithography photoresist design can be simplified since greater tolerance is achieved in the selection of via and plug locations within a layer (this may be referred to as a "bucket" approach, where a photoresist is merely used fill a plurality of generated holes, where only certain holes are subsequently selected to be maintained or deleted; (j) LWR is not critical and faster resists can be used; (k) the size of the features can be fabricated as a single shape and size, and may be applicable for electron beam direct write (EBDW) processes; and (k) via design rules are simplified and all possible vias are allowed in any geometric configuration, where the size of the vias is completely defined by the intersection of the metal above and below.

FIGS. 6A-6L illustrate portions of integrated circuit layers representing various operations in a method of self-aligned via and metal patterning, in accordance with an embodiment of the present invention. In each illustration at each described operation, plan views are shown on the left-hand side, and corresponding cross-sectional views are shown on the right-hand side. These views will be referred to herein as corresponding cross-sectional views and plan views.

Figure 6A:
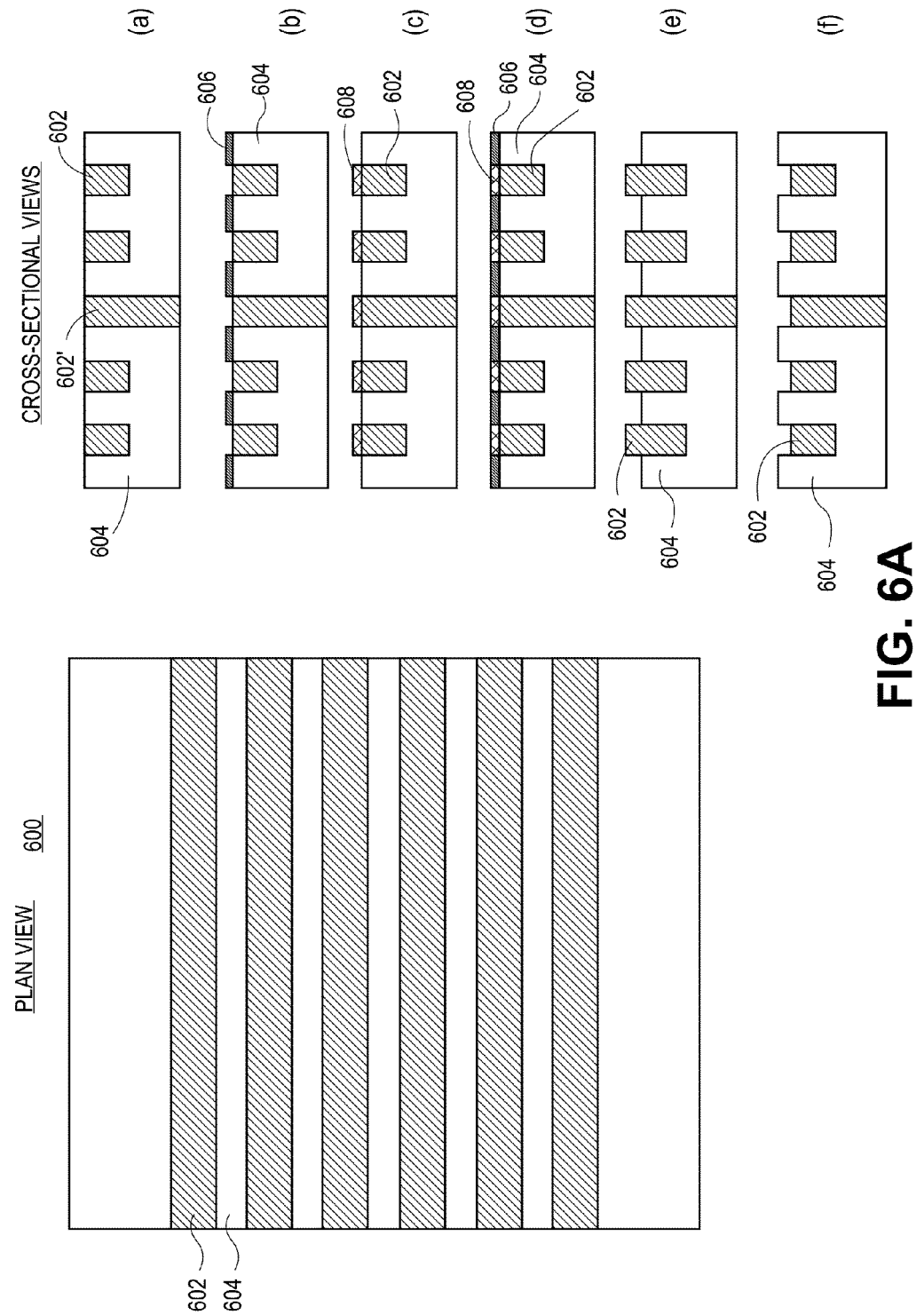

FIG. 6A illustrates a plan view and corresponding cross-sectional views of options for a previous layer metallization structure, in accordance with an embodiment of the present invention. Referring to the plan view and corresponding cross-section view option (a), a starting structure 600 includes a pattern of metal lines 602 and interlayer dielectric (ILD) lines 604. The starting structure 600 may be patterned in a grating-like pattern with metal lines spaced at a constant pitch and having a constant width (e.g., for a DSA embodiment, but not necessarily needed for a directed selective growth embodiment), as is depicted in FIG. 6A. The pattern, for example, may be fabricated by a pitch halving or pitch quartering approach. Some of the lines may be associated with underlying vias, such as line 602' shown as an example in the cross-sectional views.

Referring again to FIG. 6A, alternative options (b)-(f) address situations where an additional film is formed (e.g., deposited, grown, or left as an artifact remaining from a previous patterning process) on a surface of one of, or both of, the metal lines 602 and interlayer dielectric lines 604. In example (b), an additional film 606 is disposed on the interlayer dielectric lines 604. In example, (c), an additional film 608 is disposed on the metal lines 602. In example, (d) an additional film 606 is disposed on the interlayer dielectric lines 604, and an additional film 608 is disposed on the metal lines 602. Furthermore, although the metal lines 602 and the interlayer dielectric lines 604 are depicted as co-planar in (a), in other embodiments, they are not co-planar. For example, in (e), the metal lines 602 protrude above the interlayer dielectric lines 604. In example, (f), the metal lines 602 are recessed below the interlayer dielectric lines 604.

Referring again to examples (b)-(d), an additional layer (e.g., layer 606 or 608) can be used as a hardmask (HM) or protection layer or be used to enable a selective growth and/or self-assembly described below in association with subsequent processing operations. Such additional layers may also be used to protect the ILD lines from further processing. In addition, selectively depositing another material over the metal lines may be beneficial for similar reasons. Referring again to examples (e) and (f), it may also be possible to recess either the ILD lines or the metal lines with any combination of protective/HM materials on either or both surfaces. Overall, there exist numerous options at this stage for preparing ultimately underlying surfaces for a selective or directed self-assembly process.

In an embodiment, as used throughout the present description, interlayer dielectric (ILD) material, such as the material of the interlayer dielectric lines 604, is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material, such as the material of metal lines 602, is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect. As will be described further below, top surfaces of the lower interconnect lines may be used for self-aligned via and plug formation.

In an embodiment, as is also used throughout the present description, hardmask materials, such, as layers 606 or 608 if included as a hardmask, are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be understood that the layers and materials described in association with FIG. 6A are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 6A may be fabricated on underlying lower level interconnect layers.

Figure 6B:
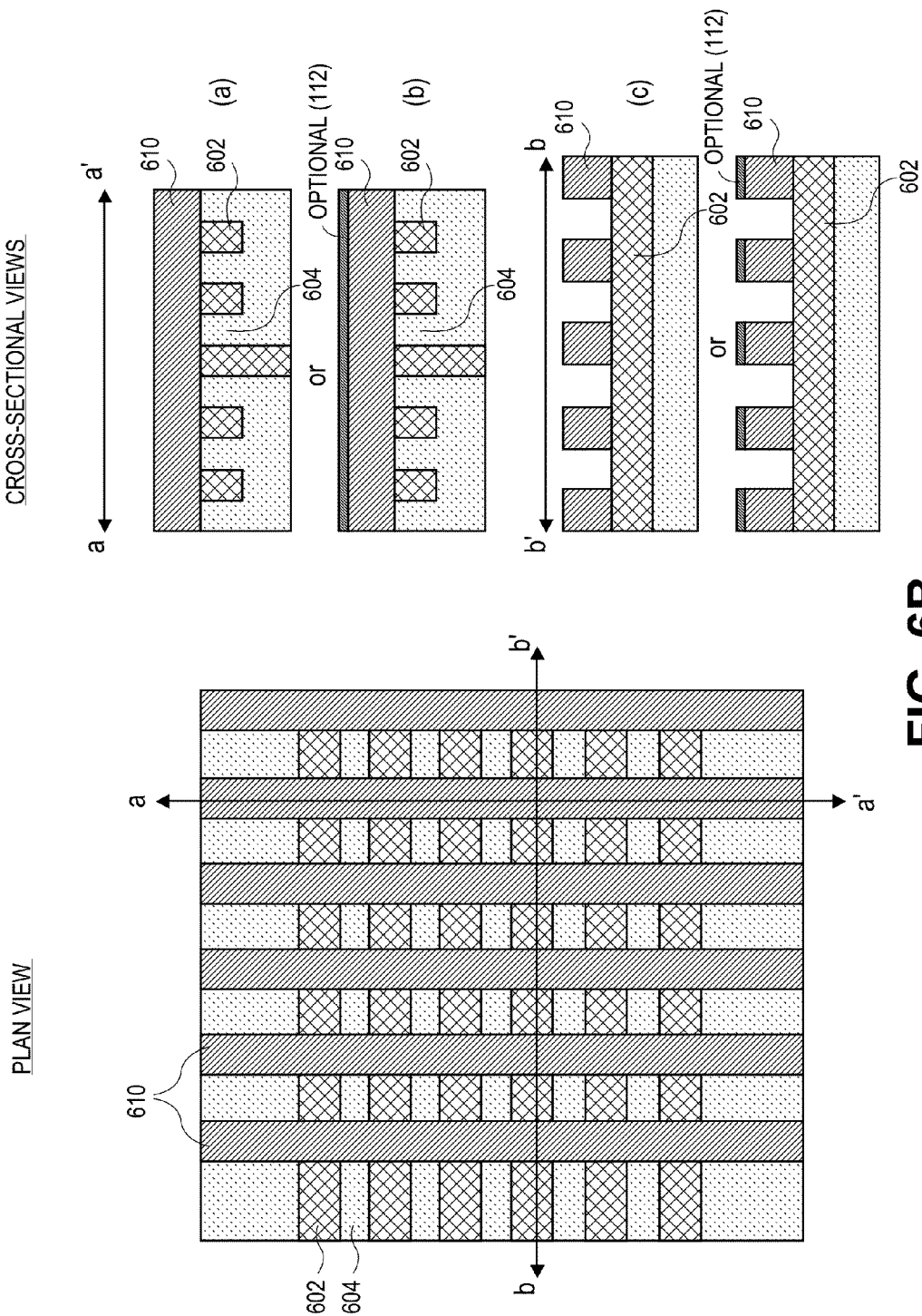

FIG. 6B illustrates a plan view and corresponding cross-sectional views of the structure of FIG. 6A following formation of interlayer dielectric (ILD) lines 610 above the structure of FIG. 6A, in accordance with an embodiment of the present invention. Referring to the plan view and corresponding cross-sectional views (a) and (c) taken along axes a-a' and c-c', respectively, the ILD lines 610 are formed in a grating structure perpendicular to the direction of underlying lines 604. In an embodiment, a blanket film of the material of lines 610 is deposited by chemical vapor deposition or like techniques. In an embodiment, the blanket film is then patterned using lithography and etch processing which may involve, e.g., spacer-based-quadruple-patterning (SBQP) or pitch quartering. It is to be understood that the grating pattern of lines 610 can be fabricated by numerous methods, including EUV and/or EBDW lithography, directed self-assembly, etc. As will be described in greater detail below, subsequent metal layer will thus be patterned in the orthogonal direction relative to the previous metal layer since the grating of lines 610 is orthogonal to the direction of the underlying structure. In one embodiment, a single 193 nm lithography mask is used with alignment/registration to the previous metal layer 602 (e.g., grating of lines 610 aligns to the previous layer 'plug' pattern in X and to the previous metal grating in Y). Referring to cross-sectional structures (b) and (d), a hardmask 612 may be formed on, or retained following pattering of, dielectric lines 610. The hardmask 612 can be used to protect lines 610 during subsequent patterning steps. As described in greater detail below, the formation of lines 610 in a grating pattern exposes regions of the previous metal lines 602 and previous ILD lines 604 (or corresponding hardmask layers on 602/604). The exposed regions correspond to all possible future via locations where metal is exposed. In one embodiment, the previous layer metal layer (e.g., lines 602) is protected, labeled, brushed, etc. at this point in the process flow.

FIG. 6C illustrates a plan view and corresponding cross-sectional views of the structure of Figure B following selective differentiation all of the potential via locations from all of the plug locations, in accordance with an embodiment of the present invention. Referring to the plan view and corresponding cross-sectional views (a)-(d) taken along axes, a-a', b-b', c-c' and d-d', respectively, following formation of ILD lines 610, a surface modification layer 614 is formed on exposed regions of the underlying ILD lines 604. In an embodiment, surface modification layer 614 is a dielectric layer. In an embodiment, surface modification layer 614 is formed by a selective bottom-up growth approach. In one such embodiment, the bottom-up growth approach involves a directed self-assembly (DSA) brush coat that has one polymer component which assembles preferentially on the underlying ILD lines 604 or, alternatively, on the metal lines 602 (or on a sacrificial layer deposited or grown on the underlying metal or ILD material).

FIG. 6D1 illustrates a plan view and corresponding cross-sectional views of the structure of FIG. 6C following differential polymer addition to the exposed portions of underlying metal and ILD lines of FIG. 6C, in accordance with an embodiment of the present invention. Referring to the plan view and corresponding cross-sectional views (a)-(d) taken along axes, a-a', b-b', c-c' and d-d', respectively, directed self-assembly (DSA) or selective growth on exposed portions of the underlying metal/MD 602/604 grating is used to form intervening lines 616 with alternating polymers or alternating polymer components in between the ILD lines 610. For example, as shown, polymer 616A (or polymer component 616A) is formed on or above the exposed portions of interlayer dielectric (ILD) lines 604 of FIG. 6C, while polymer 616B (or polymer component 616B) is formed on or above the exposed portions of the metal lines 602 of FIG. 6C. Although polymer 616A is formed on or above the surface modification layer 614 described in association with FIG. 6C (see cross-sectional views (b) and (d) of FIG. 6D1), it is to be understood that, in other embodiments, the surface modification layer 614 can be omitted and the alternating polymers or alternating polymer components can instead be formed directly in the structure described in association with FIG. 6B.

Referring again to FIG. 6D1, in an embodiment, once the surface of the underlying structure (e.g., structure 600 of FIG. 6A) has been prepared (e.g., such as the structure of FIG. 6B or the structure of FIG. 6C) or is used directly, a 50-50 diblock copolymer, such as polystyrene-polymethyl methacrylate (PS-PMMA), is coated on the substrate and annealed to drive self assembly, leading to the polymer 616A/polymer 616B layer 616 of FIG. 6D1. In one such embodiment, with appropriate surface energy conditions, the block copolymers segregate based on the underlying material exposed between ILD lines 610. For example, in a specific embodiment, polystyrene aligns selectively to the exposed portions of underlying metal lines 602 (or corresponding metal line cap or hardmask material). Meanwhile, the polymethyl methacrylate aligns selectively to the exposed portions of ILD lines 604 (or corresponding metal line cap or hardmask material).

Thus, in an embodiment, the underlying metal and ILD grid, as exposed between ILD lines 610 is recreated in the block co-polymer (BCP, i.e., polymer 616A/polymer 616B). This can particularly be so if the BCP pitch is commensurate with the underlying grating pitch. The polymer grid (polymer 616A/polymer 616B) is, in one embodiment, robust against certain small deviations from a perfect grid. For example, if small plugs effectively place an oxide or like material where a perfect grid would have metal, a perfect polymer 616A/polymer 616B grid can still be achieved. However, since the ILD lines grating is, in one embodiment, an idealized grating structure, with no metal disruptions of the ILD backbone, it may be necessary to render the ILD surface neutral since both types of polymer (616A and 616B) will, in such an instance, be exposed to ILD like material while only one type is exposed to metal.

In an embodiment, the thickness of the coated polymer (polymer 616A/polymer 616B) is approximately the same as, or slightly thicker than, the ultimate thickness of an ILD ultimately formed in its place. In an embodiment, as described in greater detail below, the polymer grid is formed not as an etch resist, but rather as scaffolding for ultimately growing a permanent ILD layer there around. As such, the thickness of the polymer 616 (polymer 616A/polymer 616B)

can be important since it may be used to define the ultimate thickness of a subsequently formed permanent ILD layer. That is, in one embodiment, the polymer grating shown in FIG. 6D1 is eventually replaced with an ILD grating of roughly the same thickness.

In an embodiment, as mentioned above, the grid of polymer 616A/polymer 616B of FIG. 6D1 is a block copolymer. In one such embodiment, the block copolymer molecule is a polymeric molecule formed of a chain of covalently bonded monomers. In a block copolymer, there are at least two different types of monomers, and these different types of monomers are primarily included within different blocks or contiguous sequences of monomers. The illustrated block copolymer molecule includes a block of polymer 616A and a block of polymer 616B. In an embodiment, the block of polymer 616A includes predominantly a chain of covalently linked monomer A (e.g., A-A-A-A-A . . . ), whereas the block of polymer 616B includes predominantly a chain of covalently linked monomer B (e.g., B-B-B-B-B . . . ). The monomers A and B may represent any of the different types of monomers used in block copolymers known in the arts. By way of example, the monomer A may represent monomers to form polystyrene, and the monomer B may represent monomers to form poly(methyl methacrylate) (PMMA), although the scope of the invention is not so limited. In other embodiments, there may be more than two blocks. Moreover, in other embodiments, each of the blocks may include different types of monomers (e.g., each block may itself be a copolymer). In one embodiment, the block of polymer 616A and the block of polymer 616B are covalently bonded together. The block of polymer 616A and the block of polymer 616B may be of approximately equal length, or one block may be significantly longer than the other.

Typically, the blocks of block copolymers (e.g., the block of polymer 616A and the block of polymer 616B) may each have different chemical properties. As one example, one of the blocks may be relatively more hydrophobic (e.g., water repelling) and the other may be relatively more hydrophilic (water attracting). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of example (as shown in FIG. 6D1), in two block copolymers, if the blocks are approximately the same length, a grid like pattern of alternating polymer 616A lines and polymer 616B lines is generated. In another embodiment (not shown), in two block copolymers, if one of the blocks is longer than the other, but not too much longer than the other, columnar structures may formed. In the columnar structures, the block copolymer molecules may align with their shorter polymer blocks microphase separated into the interior of the columns and their longer polymer blocks extending away from the columns and surrounding the columns. For example, if the block of polymer 616A were longer than the block of polymer 616B, but not too much longer, columnar structures may formed in which many block copolymer molecules align with their shorter blocks of polymer 616B forming columnar structures surrounded by a phase having the longer blocks of polymer 616A. When this occurs in an area of sufficient size, a two-dimensional array of generally hexagonally-packed columnar structures may be formed.

In an embodiment, the polymer 616A/polymer 616B grating is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located, which is in contrast to the assembled block copolymer layer portion discussed in association with the resulting structure of FIG. 6D1. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the arts for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules.

In one such embodiment, an annealing treatment may be applied to the unassembled block copolymer in order to initiate, accelerate, increase the quality of, or otherwise promote microphase separation and/or self-assembly. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of surface energy, molecular affinities, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines). In some embodiments, they may be used to form nano-scale lines or other nano-scale structures that can ultimately be used to form via and openings. In some embodiments, directed self assembly of block copolymers may be used to form vias that are self aligned with interconnects, as described in greater detail below.

Referring again to FIG. 6D1, in an embodiment, for a DSA process, in addition to direction from the underlying ILD/metal 604/602 surfaces the growth process can be affected by the sidewalls of the material of ILD lines 610. As such, in one embodiment, DSA is controlled through graphoepitaxy (from the sidewalls of lines 610) and chemoepitaxy (from the underlying exposed surface characteristics). Constraining the DSA process both physically and chemically can significantly aid the process from a defectivity standpoint. The resulting polymers 616A/616B have fewer degrees of freedom and are fully constrained in all directions through chemical (e.g., underlying ILD or metal lines, or surface modifications made thereto by, for example, a brush approach) and physical (e.g., from the trenches formed between the ILD lines 610).

In an alternative embodiment, a selective growth process is used in place of a DSA approach. FIG. 6D2 illustrates a cross-sectional view of the structure of FIG. 6B following selective material deposition on the exposed portions of underlying metal and ILD lines, in accordance with another embodiment of the present invention. Referring to FIG. 6D2, a first material type 800 is grown above exposed portions of underlying ILD lines 604. A second, different, material type 802 is grown above exposed portions of underlying metal lines 602. In an embodiment, the selective growth is achieved by a dep-etch-dep-etch approach for each of the first and second materials, resulting in a plurality of layers of each of the materials, as depicted in FIG. 6D2. Such an approach may be favorable versus conventional selective growth techniques which can form "mushroom-top" shaped films. The mushroom topping film growth tendency can be reduced through an alternating deposition/etch/deposition (dep-etch-dep-etch) approach. In another embodiment, a film is deposited selectively over the metal followed by a different film selectively over the ILD (or vice versa) and repeated numerous times creating a sandwich-like stack. In another embodiment, both materials are grown simultaneously in a reaction chamber (e.g., by a CVD style process) that grows selectively on each exposed region of the underlying substrate.

Figure 6E:
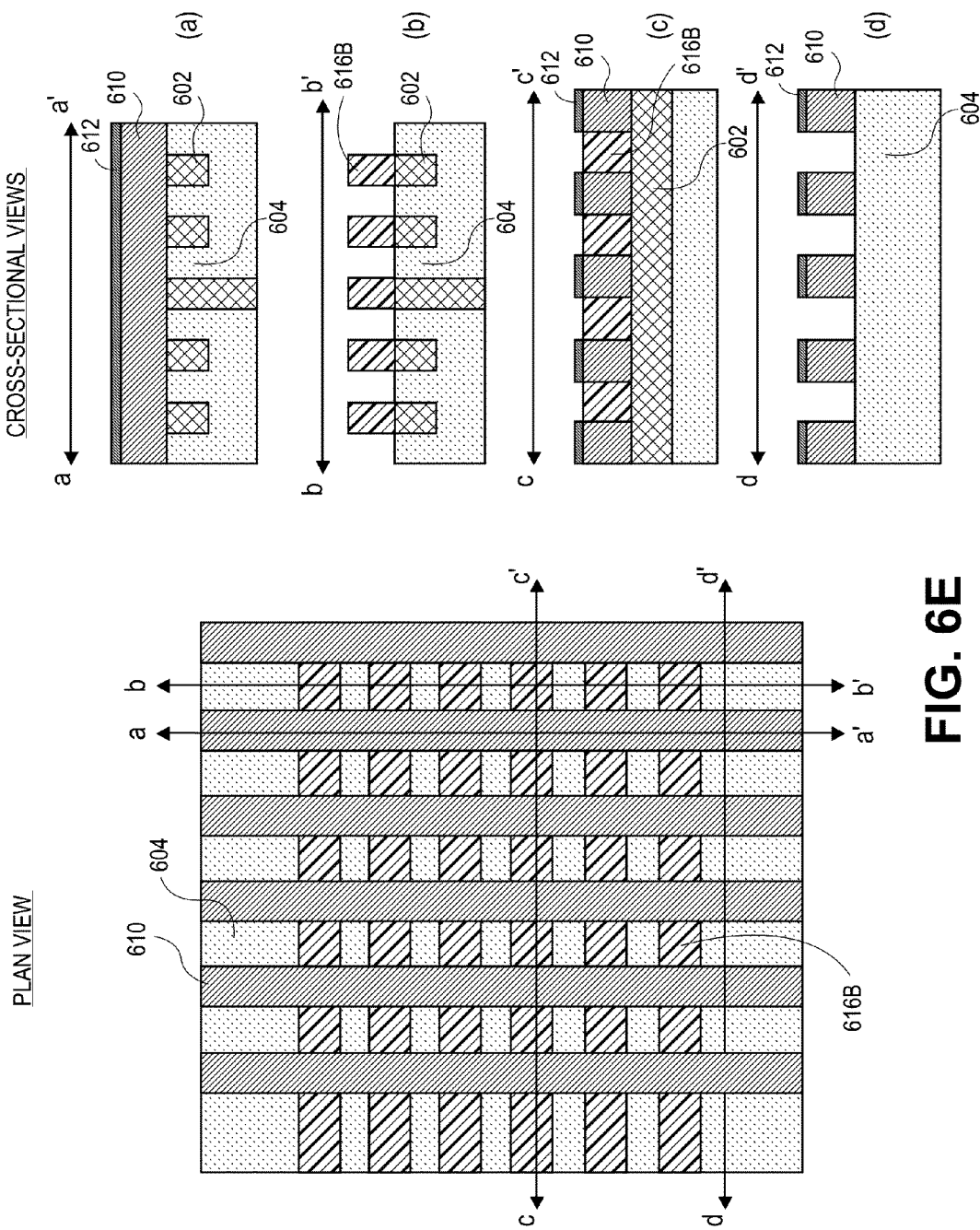

FIG. 6E illustrates a plan view and corresponding cross-sectional views of the structure of FIG. 6D1 following removal of one species of polymer, in accordance with an embodiment of the present invention. Referring to the plan view and corresponding cross-sectional views (a)-(d) taken along axes, a-a', b-b', c-c' and d-d', respectively, polymer or polymer portion 616A is removed to re-expose the ILD lines 604 (or hardmask or cap layers formed on the ILD lines 604), while polymer or polymer portion 616B is retained above the metal lines 602. In an embodiment, a deep ultraviolet (DUV) flood expose followed by a wet etch or a selective dry etch is used to selectively remove polymer 616A. It is to be understood that, instead of first removal of the polymer from the ILD lines 604 (as depicted), removal from the metal lines 602 may instead be first performed. Alternatively, a dielectric film is selectively grown over the region, and a mixed scaffolding is not used.

Figure 6F:
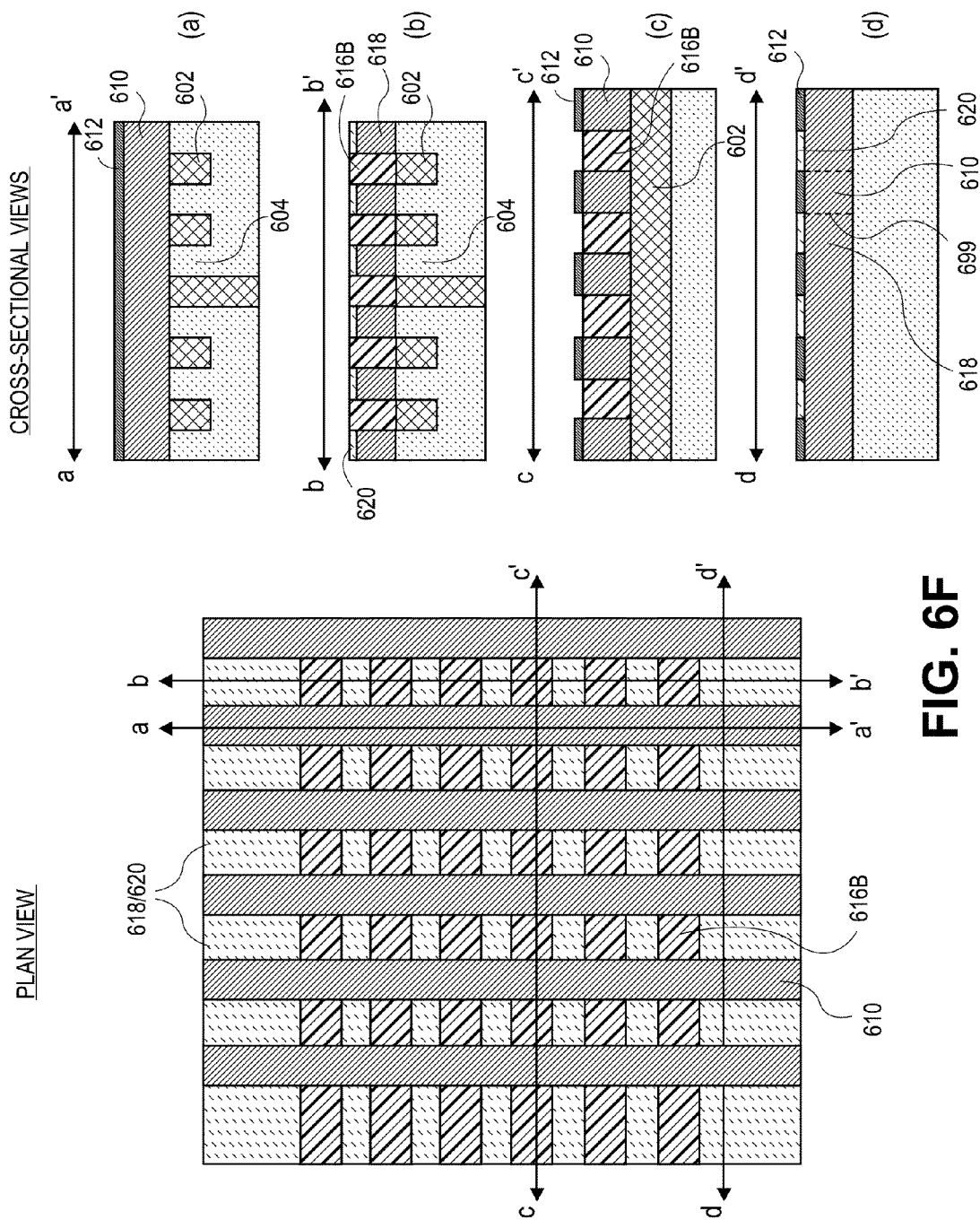

FIG. 6F illustrates a plan view and corresponding cross-sectional views of the structure of FIG. 6E following formation of an ILD material in the locations opened upon removal of the one species of polymer, in accordance with an embodiment of the present invention. Referring to the plan view and corresponding cross-sectional views (a)-(d) taken along axes, a-a', b-b', c-c' and d-d', respectively, the exposed regions of underlying ILD lines 604 are filled with a permanent interlayer dielectric (ILD) layer 618. As such, the open spaces between all possible via positions are filled with an ILD layer 618 includes a hardmask layer 620 disposed thereon, as depicted in the plan view and in the cross-sectional views (b) and (d) of FIG. 6F. It is to be understood that the material of ILD layer 618 need not be the same material as ILD lines 610. In an embodiment, the ILD layer 618 is formed by a deposition and polish process. In the case where ILD layer 618 is formed with an accompanying hardmask layer 620, a special ILD fill material may be used (e.g., polymer encapsulated nanoparticles of ILD that fills holes/trenches). In such a case, a polish operation may not be necessary.

Referring again to FIG. 6F, in an embodiment, the resulting structure includes a uniform ILD structure (ILD lines 610+ILD layer 618), and the locations of all possible plugs are covered in hardmask 620 and all possible vias are in areas of polymer 616B. In one such embodiment, ILD lines 610 and ILD layer 618 are composed of a same material. In another such embodiment, ILD lines 610 and ILD layer 618 are composed of different ILD materials. In either case, in a specific embodiment, a distinction such as a seam between the materials of ILD lines 610 and ILD layer 618 may be observed in the final structure. Exemplary seams 699 are shown in FIG. 6F for illustrative purposes.

Figure 6G:
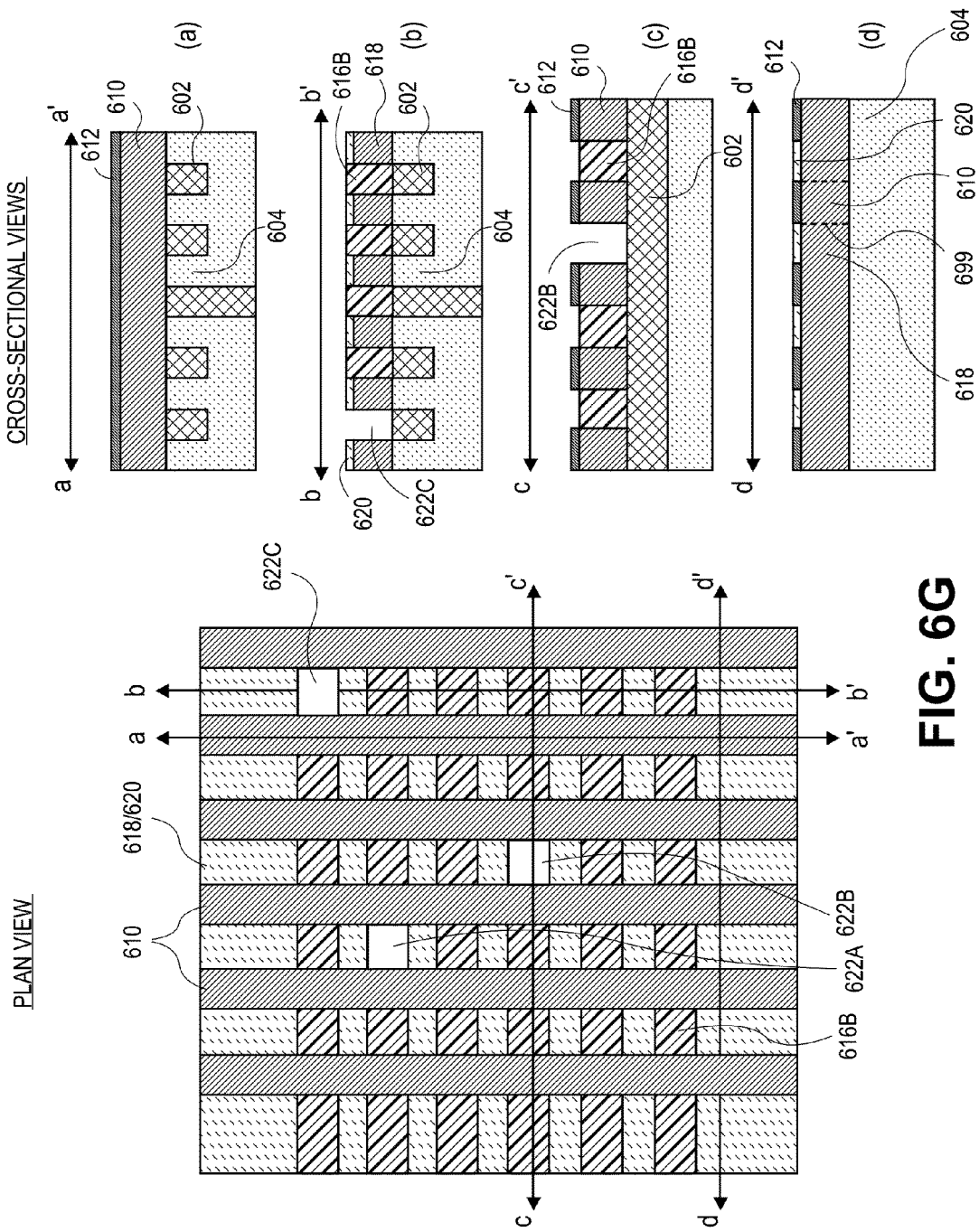

FIG. 6G illustrates a plan view and corresponding cross-sectional views of the structure of FIG. 6F following via patterning, in accordance with an embodiment of the present invention. Referring to the plan view and corresponding cross-sectional views (a)-(d) taken along axes, a-a', b-b', c-c' and d-d', respectively, via locations 622A, 622B and 622C are opened by removal of polymer 616B in select locations. In an embodiment, selective via location formation is accomplished by using a lithographic technique. In one such embodiment, polymer 616B is globally removed with an ash and refilled with photoresist. The photoresist may be highly sensitive and have a large acid diffusion and aggressive deprotection or crosslinking (depending on resist tone) because the latent image is confined in both directions by ILD (e.g., by ILD lines 610 and ILD layer 618). The resist serves as a digital switch to turn "on" or "off" depending whether a via is required in a particular location or not. Ideally, the photoresist can be used to fill the holes only, without spilling over. In an embodiment, the via locations 622A, 622B and 622C are fully confined with the process such that line edge or width roughness (LWR) and line collapse and/or reflection is mitigated if not eliminated. In an embodiment, low doses are used with EUV/EBDW and increase runrate significantly. In one embodiment, an additional advantage with the use of EBDW is that only a single shot type/size that can increase runrate by significantly reducing the number of apertures required as well as lowering the dose that needs to be delivered. In a case that 193 nm immersion lithography is used, in an embodiment, the process flow confines the via locations in both directions such the size of the via that actually is patterned is twice the size of the actual via on the wafer (e.g., assuming 1:1 line/space patterns). Alternatively, the via locations can be selected in the reverse tone where the vias that need to be retained are protected with photoresist and the remaining sites are removed and later filled with ILD. Such an approach can allow a single metal fill/polish process at the end of the patterning flow rather than two separate metal deposition steps.

Figure 6H:
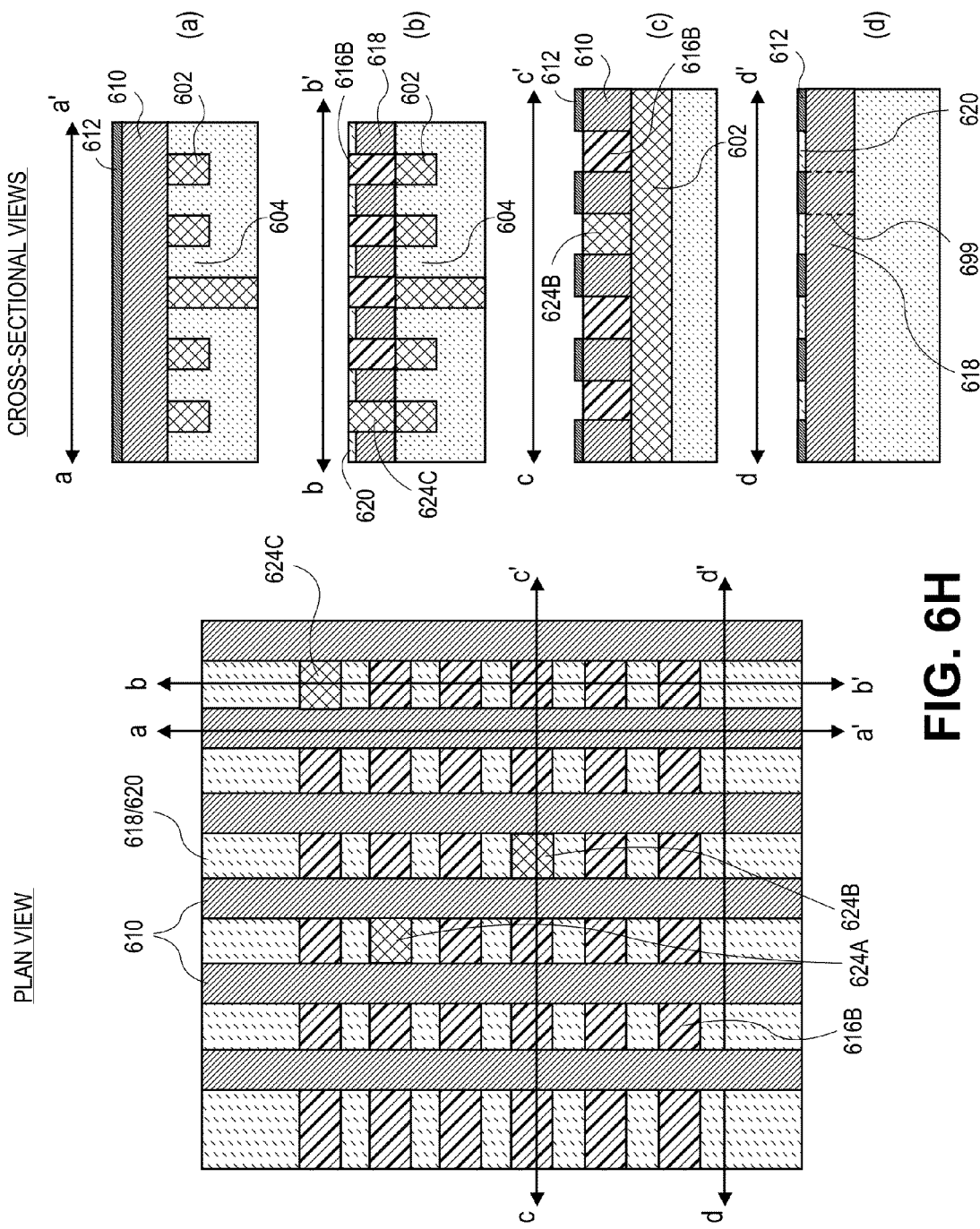

FIG. 6H illustrates a plan view and corresponding cross-sectional views of the structure of FIG. 6G following via formation using a selective metal deposition process, in accordance with an embodiment of the present invention. Referring to the plan view and corresponding cross-sectional views (a)-(d) taken along axes, a-a', b-b', c-c' and d-d', respectively, via locations 622A, 622B and 622C are filled with metal to form vias 624A, 624B and 624C, respectively. In an embodiment, via locations 622A, 622B and 622C are filled using a selective metal deposition process. In one such embodiment, a metal-diazabutadiene precursor (as described above in association with FIG. 1) is used to via locations 622A, 622B and 622C selectively against all other exposed dielectric materials (e.g., as described above in association with FIG. 2). As such, in accordance with an embodiment of the present invention, via locations 622A, 622B and 622C are filled without using a conventional metal over-fill polishing process.

Figure 6I:
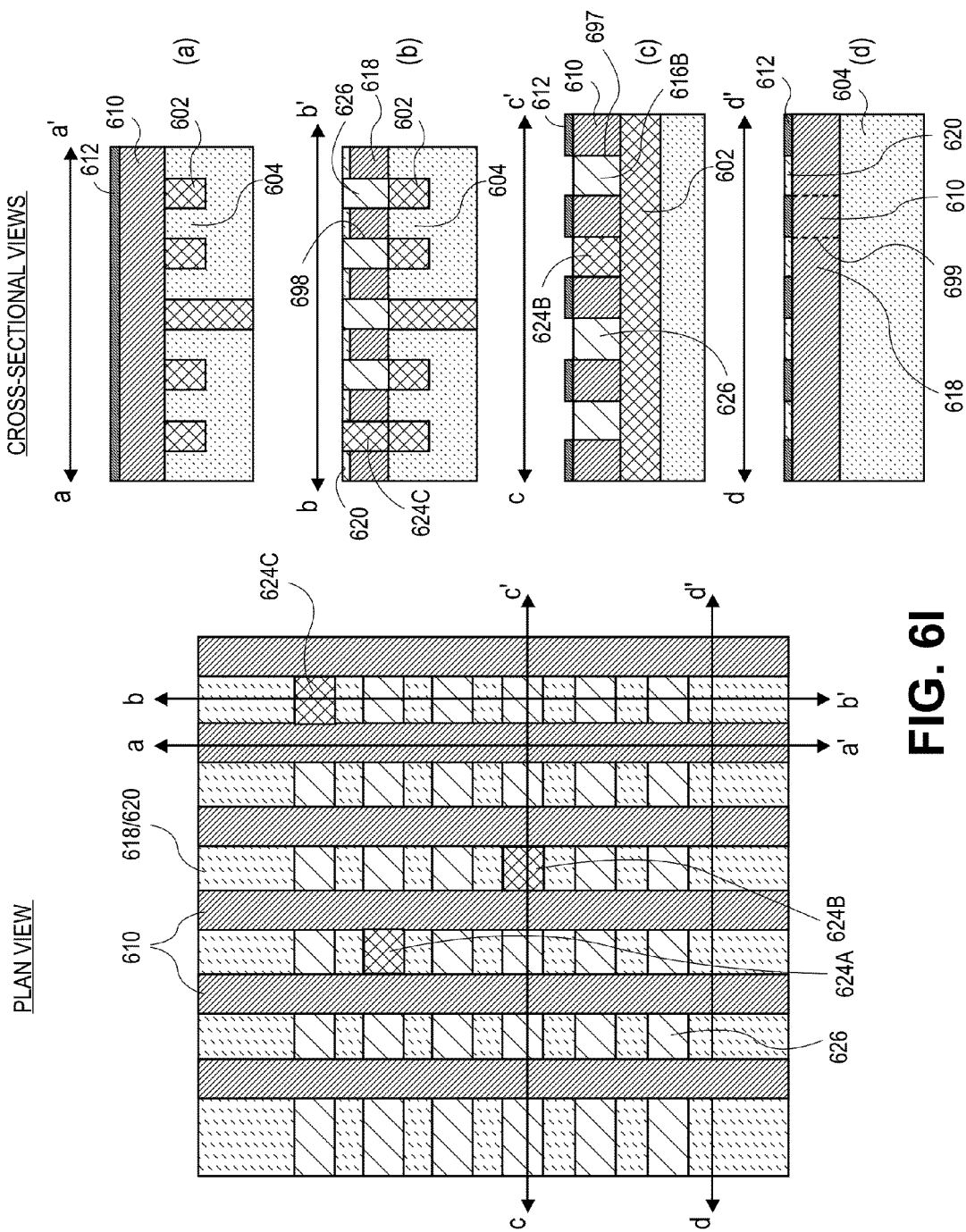

FIG. 6I illustrates a plan view and corresponding cross-sectional views of the structure of FIG. 6H following removal of the second species of polymer and replacement with an ILD material, in accordance with an embodiment of the present invention. Referring to the plan view and corresponding cross-sectional views (a)-(d) taken along axes, a-a', b-b', c-c' and d-d', respectively, remaining polymer or polymer portion 616B (e.g., where vias locations have not been selected) is removed to re-expose the metal lines 602. Subsequently, an ILD layer 626 is formed in the locations where the remaining polymer or polymer portion 616B was removed, as depicted in FIG. 6I.

Referring again to FIG. 6I, in an embodiment, the resulting structure includes a uniform ILD structure (ILD lines 610+ ILD layer 618+ILD layer 626), and the locations of all possible plugs are covered in hardmask 620. In one such embodiment, ILD lines 610, ILD layer 618 and ILD layer 626 are composed of a same material. In another such embodiment, two of ILD lines 610, ILD layer 618 and ILD layer 626 are composed of a same material and the third is composed of a different ILD material. In yet another such embodiment, all of ILD lines 610, ILD layer 618 and ILD layer 626 are composed of a different ILD material with respect to one another. In any case, in a specific embodiment, a distinction such as a seam between the materials of ILD lines 610 and ILD layer 626 may be observed in the final structure. Exemplary seams 697 are shown in FIG. 6I for illustrative purposes. Likewise, a distinction such as a seam between the materials of ILD layer 618 and ILD layer 626 may be observed in the final structure. Exemplary seams 698 are shown in FIG. 6I for illustrative purposes.

FIG. 6J illustrates a plan view and corresponding cross-sectional views of the structure of FIG. 6I following patterning of a resist or mask in selected plug locations, in accordance with an embodiment of the present invention. Referring to the plan view and corresponding cross-sectional views (a) and (b) taken along axes, a-a' and b-b', respectively, plug positions 628A, 628B and 628C are preserved by forming a mask or resist layer over those locations. Such preservation patterning may be referred to as metal end-to-end lithographic patterning, wherein plug positions are determined where breaks in subsequently formed metal lines are required. It is to be understood that since the plug locations can only be in those locations where ILD layer 618/hardmask 620 are positioned, plugs can occur over the previous layer ILD lines 604. In an embodiment, the patterning is achieved by using a lithography operation (e.g., EUV, EBDW or immersion 193 nm). In an embodiment, the process illustrated in FIG. 6J, demonstrates use of a positive tone patterning process where the regions where spaces between metal need to occur are preserved. It is to be understood that, in another embodiment, it is also possible to open holes instead and reverse the tone of the process.

Figure 6K:
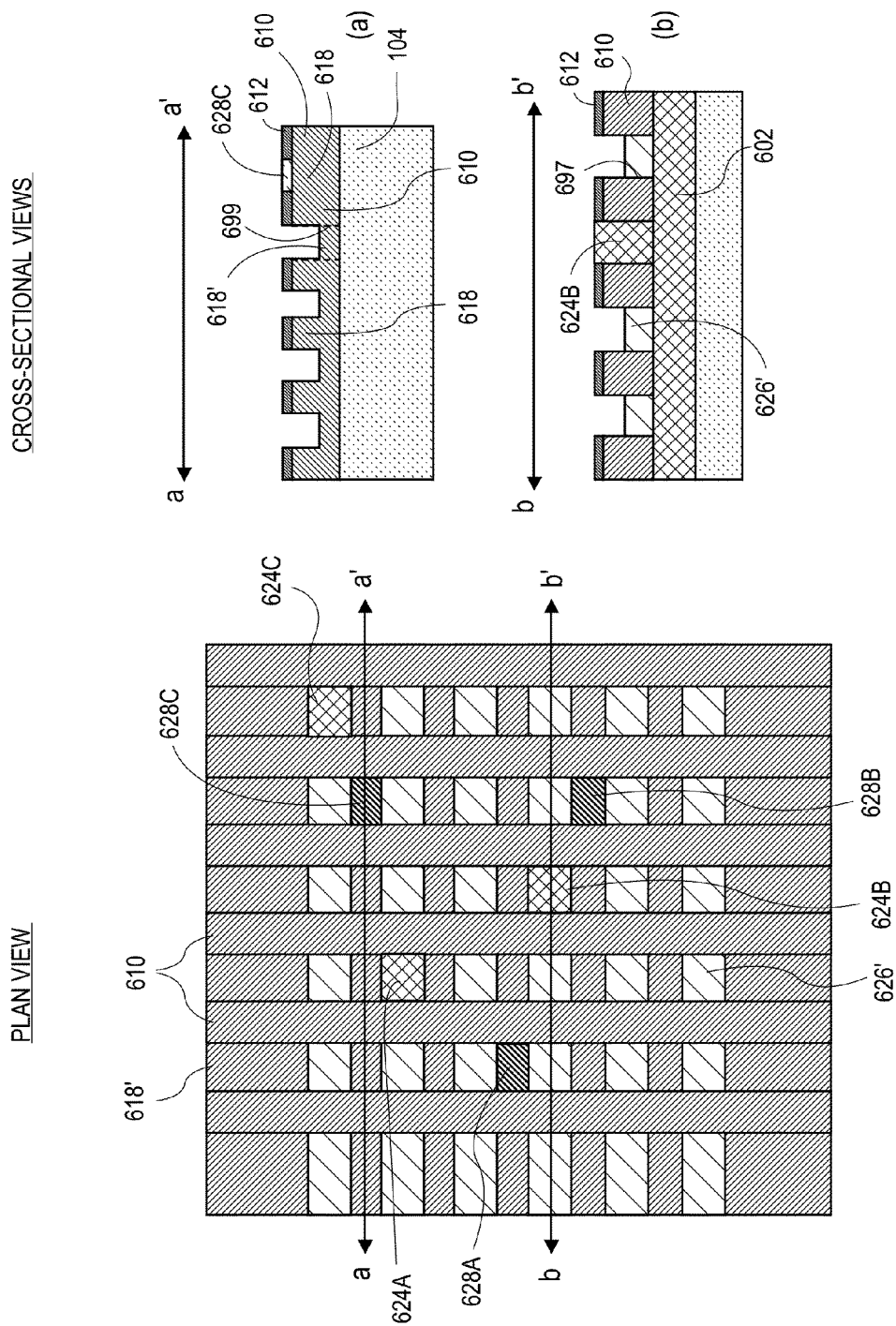

FIG. 6K illustrates a plan view and corresponding cross-sectional views of the structure of FIG. 6J following hardmask removal and ILD layer recessing, in accordance with an embodiment of the present invention. Referring to the plan view and corresponding cross-sectional views (a) and (b) taken along axes, a-a' and b-b', respectively, hardmask 620 is removed and ILD layer 618 and ILD layer 626 are recessed to form recessed ILD layer 618' and recessed ILD layer 626', respectively, by etching of these layers below their original uppermost surfaces. It is to be understood that the recessing of ILD layer 618 and ILD layer 626 is performed without etching or recessing ILD lines 610. The selectivity may be achieved by use of a hardmask layer 612 on the ILD lines (as depicted in cross-sectional views (a) and (b)). Alternatively, in a case that the ILD lines 610 are composed of an ILD material different from the material of ILD layer 618 and ILD layer 626, a selective etch may be used even in the absence of a hardmask 612. The recessing of ILD layer 618 and ILD layer 626 is to provide locations for the second level of metal lines, as isolated by ILD lines 610, as described below. The extent or depth of the recess is, in one embodiment, selected based on the desired ultimate thickness of the metal lines formed thereon. It is to be understood that the ILD layer 618 in the plug locations 628A, 628B and 628C is not recessed.

FIG. 6L illustrates a plan view and corresponding cross-sectional views of the structure of FIG. 6K following metal line formation, in accordance with an embodiment of the present invention. Referring to the plan view and corresponding cross-sectional views (a), (b) and (c) taken along axes, a-a', b-b' and c-c', respectively, metal for forming metal interconnect lines is formed conformally above the structure of FIG. 6K. The metal is then planarized, e.g., by CMP, to provide metal lines 630, which are confined to locations above recessed ILD layer 618' and recessed ILD layer 626'. The metal lines 630 are coupled with underlying metal lines 602 through the predetermined via locations 624A, 624B and 624C (624B is shown in cross-sectional view (c); note that for illustrative purposes, another via 632 is depicted directly adjacent plug 628B in cross-sectional view (b) even though this is inconsistent with the previous figures). The metal lines 630 are isolated from one another by ILD lines 610 and are disrupted or broken-up by the preserved plugs 628A, 628B and 628C. Any hardmask remaining on the plug locations and/or on the ILD lines 610 may be removed at this portion of the process flow, as depicted in FIG. 6L. The metal (e.g., copper and associated barrier and seed layers) deposition and planarization process to form metal lines 630 may be that typically used for standard back end of line (BEOL) single or dual damascene processing. In an embodiment, in subsequent fabrication operations, the ILD lines 610 may be removed to provide air gaps between the resulting metal lines 630.

The structure of FIG. 6L may subsequently be used as a foundation for forming subsequent metal line/via and ILD layers. Alternatively, the structure of FIG. 6L may represent the final metal interconnect layer in an integrated circuit. It is to be understood that the above process operations may be practiced in alternative sequences, not every operation need be performed and/or additional process operations may be performed. Furthermore, although the above process flow focused on applications of directed self-assembly (DSA), selective growth processes may be used instead in one or more locations of the process flow. In any case, the resulting structures enable fabrication, by selective metal deposition, of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
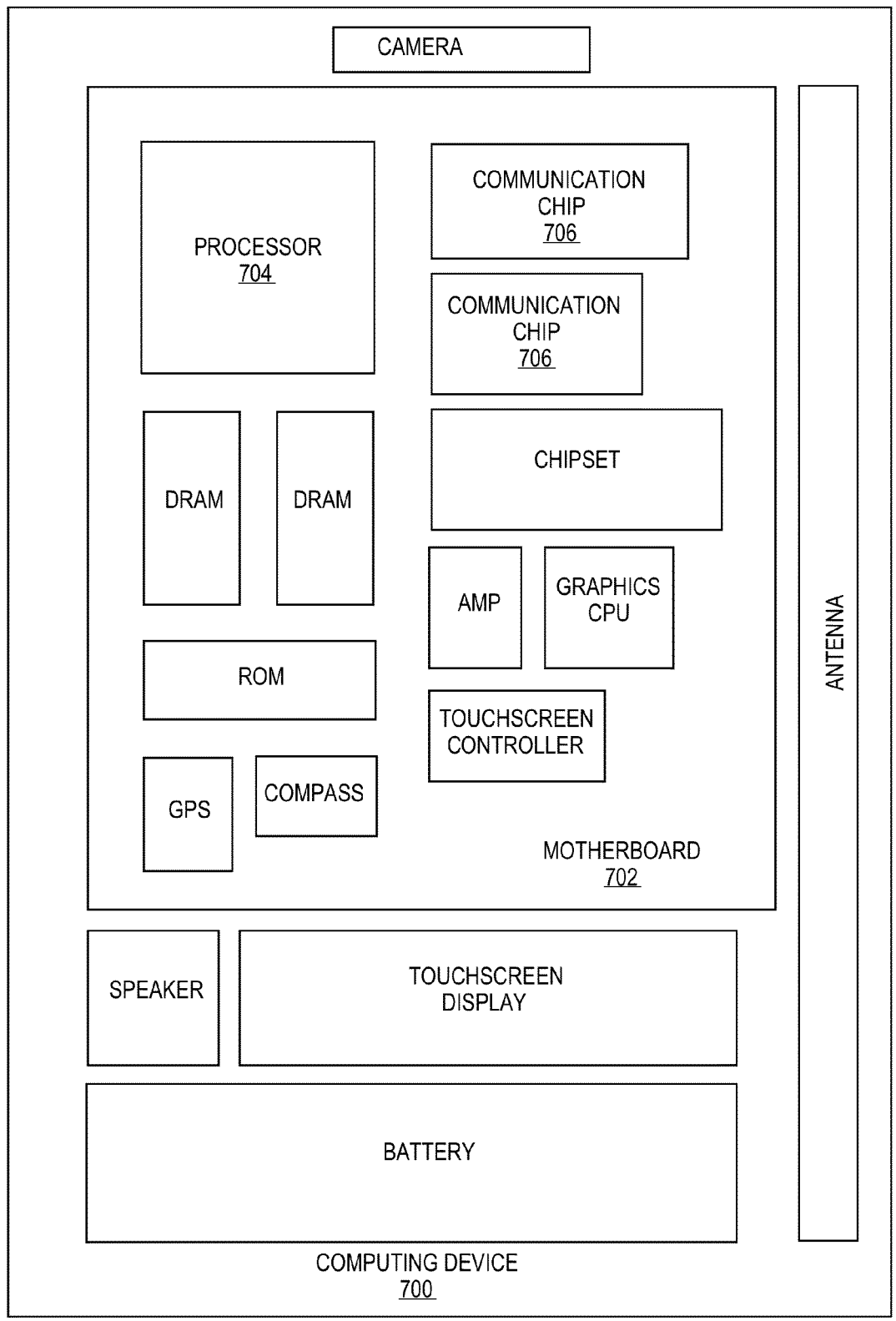
FIG. 7 illustrates a computing device in accordance with one implementation of the invention.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor includes one or more structures, such as metal structures formed by selective metal deposition, built in accordance with implementations of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip includes one or more structures, such as metal structures formed by selective metal deposition, built in accordance with implementations of the invention.

In further implementations, another component housed within the computing device 700 may contain an integrated circuit die that includes one or more structures, such as metal structures formed by selective metal deposition, built in accordance with implementations of the invention.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments of the present invention include selective area deposition of metal films by atomic layer deposition (ALD) and chemical vapor deposition (CVD).

In an embodiment, a method of fabricating a metallization structure for an integrated circuit involves forming an exposed surface above a substrate, the exposed surface including regions of exposed dielectric material and regions of exposed metal. The method also involves forming, using a selective metal deposition process, a metal layer on the regions of exposed metal without forming the metal layer on the regions of exposed dielectric material.

In one embodiment, forming the metal layer by using the selective metal deposition process involves using a precursor molecule possessing electron-acceptor ligands on a late transition metal center.

In one embodiment, using the precursor molecule involves using an N,N'-dialkyl-diazabutadiene metal precursor complex.

In one embodiment, the N,N'-dialkyl-diazabutadiene metal precursor complex includes the late transition metal center such as, but not limited to, Mn, Cr, Fe, Co or Ni.

In one embodiment, the N,N'-dialkyl-diazabutadiene metal precursor complex has two N,N'-dialkyl-diazabutadiene ligands.

In one embodiment, the N,N'-dialkyl-diazabutadiene metal precursor complex includes the late transition metal center such as, but not limited to, Ru, Mo or W.

In one embodiment, the N,N'-dialkyl-diazabutadiene metal precursor complex has three N,N'-dialkyl-diazabutadiene ligands.

In one embodiment, forming the metal layer by using the selective metal deposition process involves forming the metal layer at a temperature approximately in the range of 175-275 degrees Celsius.

In one embodiment, forming the metal layer by using the selective metal deposition process involves forming a metal layer such as, but not limited to, Mn, Cr, Fe, Co, Ni, Ru, Mo or W.

In one embodiment, the exposed dielectric material layer is one such as, but not limited to, silicon dioxide or a low-k dielectric material.

In an embodiment, a method of fabricating a metallization structure for an integrated circuit involves forming a plurality of tungsten (W) contacts in a dielectric layer to provide exposed regions of the dielectric layer and exposed regions of the tungsten contacts. The method also involves forming, using a selective metal atomic layer deposition (ALD) or chemical vapor deposition (CVD) process, a metal layer on the exposed regions of the tungsten contacts without forming the metal layer on the exposed regions of the dielectric layer. The metal layer is one such as, but not limited to, Mn, Cr, Fe, Co, Ni, Ru, Mo or W.

In one embodiment, forming the metal layer by using the selective metal ALD or CVD process involves using an N,N'-dialkyl-diazabutadiene metal precursor complex.

In one embodiment, the N,N'-dialkyl-diazabutadiene metal precursor complex includes a metal center such as, but not limited to, Mn, Cr, Fe, Co or Ni, and the N,N'-dialkyl-diazabutadiene metal precursor complex has two N,N'-dialkyl-diazabutadiene ligands.

In one embodiment, the N,N'-dialkyl-diazabutadiene metal precursor complex includes a metal center such as, but not limited to, Ru, Mo or W, and the N,N'-dialkyl-diazabutadiene metal precursor complex has three N,N'-dialkyl-diazabutadiene ligands.

In one embodiment, forming the metal layer by using the selective metal ALD or CVD process involves forming the metal layer at a temperature approximately in the range of 175-275 degrees Celsius.

In an embodiment, a method of fabricating an interconnect structure for an integrated circuit involves providing a previous layer metallization structure having an alternating metal line and dielectric line first grating pattern having a first direction. The method also involves forming a dielectric line second grating pattern above the previous layer metallization structure, the dielectric line second grating pattern having a second direction, perpendicular to the first direction. The method also involves forming a sacrificial structure above the first grating pattern and between the dielectric lines of the second grating pattern. The method also involves replacing portions of the sacrificial structure above and aligned with the metal lines of the first grating pattern with a first dielectric layer, and replacing portions of the sacrificial structure above and aligned with the dielectric lines of the first grating pattern with a second dielectric layer. The method also involves forming, by using a selective metal deposition process, one or more conductive vias in the first dielectric layer, on exposed portions of the metal lines of the first grating pattern. The method also involves recessing portions of the first and second dielectric layers. The method also involves forming a plurality of metal lines in the recessed portions of the first and second dielectric layers, coupled with the one or more conductive vias, the plurality of metal lines having the second direction.

In one embodiment, forming the one or more conductive vias by using the selective metal deposition process involves using a precursor molecule possessing electron-acceptor ligands on a late transition metal center.

In one embodiment, using the precursor molecule involves using an N,N'-dialkyl-diazabutadiene metal precursor complex.

In one embodiment, the N,N'-dialkyl-diazabutadiene metal precursor complex includes the late transition metal center such as, but not limited to, Mn, Cr, Fe, Co or Ni, and the N,N'-dialkyl-diazabutadiene metal precursor complex has two N,N'-dialkyl-diazabutadiene ligands.

In one embodiment, the N,N'-dialkyl-diazabutadiene metal precursor complex includes the late transition metal center such as, but not limited to, Ru, Mo or W, and the N,N'-dialkyl-diazabutadiene metal precursor complex has three N,N'-dialkyl-diazabutadiene ligands.

In one embodiment, forming the one or more conductive vias by using the selective metal deposition process involves forming the one or more conductive vias at a temperature approximately in the range of 175-275 degrees Celsius.

In one embodiment, a metal line of the plurality of metal lines in the recessed portions of the first and second dielectric layers is electrically coupled to a metal line of the previous layer metallization structure by one of the one or more conductive vias, the conductive via having a center directly aligned with a center of the metal line of the previous layer metallization structure and with a center of the metal line of the plurality of metal lines in the recessed portions of the first and second dielectric layers.

In one embodiment, forming the first dielectric layer and the second dielectric layer involves forming a different material for each layer, and forming the one or more conductive vias is performed without deposition on exposed portions of the first dielectric layer and the second dielectric layer.

In one embodiment, forming the first dielectric layer and the second dielectric layer involves forming a same material for each layer, and forming the one or more conductive vias is performed without deposition on exposed portions of the first dielectric layer and the second dielectric layer.

What is claimed is:

1. A method of fabricating an interconnect structure for an integrated circuit, the method comprising:
providing a previous layer metallization structure comprising an alternating metal line and dielectric line first grating pattern having a first direction;
forming a dielectric line second grating pattern above the previous layer metallization structure, the dielectric line second grating pattern having a second direction, perpendicular to the first direction;
forming a sacrificial structure above the first grating pattern and between the dielectric lines of the second grating pattern;
replacing portions of the sacrificial structure above and aligned with the metal lines of the first grating pattern with a first dielectric layer, and replacing portions of the sacrificial structure above and aligned with the dielectric lines of the first grating pattern with a second dielectric layer;
forming, by using a selective metal deposition process, one or more conductive vias in the first dielectric layer, on exposed portions of the metal lines of the first grating pattern;

recessing portions of the first and second dielectric layers; and forming a plurality of metal lines in the recessed portions of the first and second dielectric layers, coupled with the one or more conductive vias, the plurality of metal lines having the second direction.

2. The method of claim 1, wherein forming the one or more conductive vias by using the selective metal deposition process comprises using a precursor molecule possessing electron-acceptor ligands on a late transition metal center.

3. The method of claim 2, wherein using the precursor molecule comprises using an N,N'-dialkyl-diazabutadiene metal precursor complex.

4. The method of claim 3, wherein the N,N'-dialkyl-diazabutadiene metal precursor complex includes the late transition metal center selected from the group consisting of Mn, Cr, Fe, Co and Ni, and wherein the N,N'-dialkyl-diazabutadiene metal precursor complex has two N,N'-dialkyl-diazabutadiene ligands.

5. The method of claim 3, wherein the N,N'-dialkyl-diazabutadiene metal precursor complex includes the late transition metal center selected from the group consisting of Ru, Mo and W, and wherein the N,N'-dialkyl-diazabutadiene metal precursor complex has three N,N'-dialkyl-diazabutadiene ligands.

6. The method of claim 1, wherein forming the one or more conductive vias by using the selective metal deposition process comprises forming the one or more conductive vias at a temperature approximately in the range of 175-275 degrees Celsius.

7. The method of claim 1, wherein a metal line of the plurality of metal lines in the recessed portions of the first and second dielectric layers is electrically coupled to a metal line of the previous layer metallization structure by one of the one or more conductive vias, the conductive via having a center directly aligned with a center of the metal line of the previous layer metallization structure and with a center of the metal line of the plurality of metal lines in the recessed portions of the first and second dielectric layers.

8. The method of claim 1, wherein forming the first dielectric layer and the second dielectric layer comprises forming a different material for each layer, and wherein forming the one or more conductive vias is performed without deposition on exposed portions of the first dielectric layer and the second dielectric layer.

9. The method of claim 1, wherein forming the first dielectric layer and the second dielectric layer comprises forming a same material for each layer, and wherein forming the one or more conductive vias is performed without deposition on exposed portions of the first dielectric layer and the second dielectric layer.

* * * * *